US009236318B1

(12) United States Patent
Ito et al.

(10) Patent No.: US 9,236,318 B1
(45) Date of Patent: Jan. 12, 2016

(54) GLASS COMPOSITION FOR PROTECTING SEMICONDUCTOR JUNCTION, METHOD OF MANUFACTURING SEMICONDUCTOR DEVICE AND SEMICONDUCTOR DEVICE

(71) Applicant: SHINDENGEN ELECTRIC MANUFACTURING CO., LTD., Tokyo (JP)

(72) Inventors: Koji Ito, Hanno (JP); Atsushi Ogasawara, Hanno (JP); Koya Muyari, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/233,108

(22) PCT Filed: Mar. 29, 2013

(86) PCT No.: PCT/JP2013/059761
§ 371 (c)(1),
(2) Date: Jan. 15, 2014

(87) PCT Pub. No.: WO2014/155739
PCT Pub. Date: Oct. 2, 2014

(51) Int. Cl.
H01L 21/302 (2006.01)
H01L 23/58 (2006.01)
H01L 23/29 (2006.01)
H01L 21/02 (2006.01)
H01L 23/31 (2006.01)

(52) U.S. Cl.
CPC ........ H01L 23/291 (2013.01); H01L 21/02161 (2013.01); H01L 23/3171 (2013.01)

(58) Field of Classification Search
CPC ...................................................... H01L 23/291
USPC .......................... 257/634, 641, 644; 438/723
See application file for complete search history.

(56) References Cited

U.S. PATENT DOCUMENTS

2014/0353851 A1* 12/2014 Muyari ................. H01L 23/291
257/794

FOREIGN PATENT DOCUMENTS

| GB | 1349163 A | 3/1974 |
| JP | 5117027 B1 | 5/1976 |
| JP | 5117028 B1 | 5/1976 |
| JP | 56045055 A | 4/1981 |
| JP | 58190836 A | 11/1983 |
| JP | 2004087955 A | 3/2004 |
| WO | 2011093177 A1 | 8/2011 |
| WO | 2012160962 A1 | 11/2012 |
| WO | 2013027636 A1 | 2/2013 |

OTHER PUBLICATIONS

International Search Report corresponding to PCT/JP2013/059761 dated May 21, 2013.

* cited by examiner

Primary Examiner — Calvin Lee
(74) Attorney, Agent, or Firm — Hauptman Ham, LLP

(57) ABSTRACT

A glass composition for protecting a semiconductor junction is made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO and substantially contains none of Pb, As, Sb, Li, Na and K, the glass composition for protecting a semiconductor junction containing no filler.

17 Claims, 15 Drawing Sheets

| | item | example 1 | example 2 | example 3 | example 4 | example 5 | example 6 | comparison example 1 | comparison example 2 |
|---|---|---|---|---|---|---|---|---|---|
| composition ratio (mol ratio) | ZnO | 53.2 | 52.9 | 49.7 | 44.8 | 38.3 | 44.5 | 9.0 | 0 |
| | SiO₂ | 9.2 | 9.2 | 9.3 | 15.5 | 37.8 | 15.4 | 58.3 | 74.8 |
| | B₂O₃ | 25.6 | 25.4 | 25.8 | 25.1 | 10.2 | 25.0 | 11.7 | 0 |
| | Al₂O₃ | 8.6 | 8.6 | 8.7 | 8.5 | 8.2 | 8.4 | 12.0 | 4.7 |
| | BaO | 2.0 | 2.0 | 2.0 | 2.0 | 1.9 | 2.0 | 5.0 | 0 |
| | CaO | 1.4 | 1.4 | 1.4 | 1.4 | 1.3 | 1.2 | 2.7 | 0 |
| | MgO | 0 | 0 | 0 | 0 | 0 | 0.8 | 1.3 | 0 |
| | ZrO₂ | 0 | 0 | 2.0 | 2.2 | 1.8 | 2.2 | 0 | 0 |
| | NiO | 0 | 0.5 | 1.1 | 0.5 | 0.5 | 0.5 | 0 | 0 |
| | PbO | 0 | 0 | 0 | 0 | 0 | 0 | 0 | 20.5 |
| | total | 100.0 | 100.0 | 100.0 | 100.0 | 100.0 | 100.0 | 100.0 | 100.0 |
| heat characteristic | linear expansion coefficient (50–500°C) | 5.00 | 5.02 | 5.30 | 5.30 | 4.69 | 5.22 | 3.65 | 4.22 |
| | glass transition point Tg(°C) | 570.2 | 571.6 | 575.4 | 596.7 | 647.3 | 595.2 | 695.5 | 636.0 |
| | softening point Ts(°C) | 624.4 | 625.4 | 622.8 | 649.2 | 703.9 | 650.0 | 788.6 | 683.0 |
| | deformation point Tf(°C) | 648.0 | 649.0 | 650.1 | 686.5 | 780.6 | 687.3 | 880.0 | 826.2 |
| evaluation aspect | evaluation aspect 1 (environmental load) | good | good | good | good | good | good | good | bad |
| | evaluation aspect 2 (baking temperature) | good (630°C) | good (630°C) | good (680°C) | good (720°C) | good (750°C) | good (720°C) | fair (870°C) | fair (870°C) |
| | evaluation aspect 3 (chemical resistance) | fair | fair | fair | fair | fair | fair | good | good |
| | evaluation aspect 4 (presence or non-presence of crystallization) | good | good | good | good | good | good | good | good |
| | evaluation aspect 5 (presence or non-presence of generation of bubbles) | fair | good | good | good | good | good | good | good |
| | evaluation aspect 6 (reverse leakage current) | good | good | good | good | good | good | good | good |
| | evaluation aspect 7 (reverse recovery time trr) | — | — | — | good (39.6ns) | — | — | fair (43.6ns) | — |
| comprehensive evaluation 1 ※1 | | fair | fair | fair | fair | fair | fair | fair | bad |
| comprehensive evaluation 2 ※2 | | fair | good | good | good | good | good | fair | bad |
| comprehensive evaluation 3 ※3 | | good | good | good | good | good | good | fair | bad |

※1: condition 1: (glass layer being directly formed on pn junction surface, glass protection film not used in etching oxide film)
※2: condition 2: (glass layer being directly formed on pn junction surface, glass protection film used in etching oxide film)
※3: condition 3: (glass layer being formed on pn junction surface with insulation layer interposed therebetween, glass protection film used in etching oxide film)

FIG.11

GLASS COMPOSITION FOR PROTECTING SEMICONDUCTOR JUNCTION, METHOD OF MANUFACTURING SEMICONDUCTOR DEVICE AND SEMICONDUCTOR DEVICE

RELATED APPLICATIONS

The present application is a National Phase of International Application Number PCT/JP2013/059761, filed Mar. 29, 2013.

TECHNICAL FIELD

The present invention relates to a glass composition for protecting a semiconductor junction, a method of manufacturing a semiconductor device and such a semiconductor device.

BACKGROUND ART

There has been known a method of manufacturing a semiconductor device where a glass layer for passivation is formed such that the glass layer covers a pn junction exposure portion in a process of manufacturing a mesa semiconductor device (see patent literature 1, for example). In manufacturing a semiconductor device which exhibits an excellent switching characteristic (a fast recovery diode) by using such a method of manufacturing a semiconductor device, the following manufacturing method is adopted. Hereinafter, such a manufacturing method is referred to as "conventional method of manufacturing a semiconductor device".

FIG. 16 (a) to FIG. 16 (d) and FIG. 17(a) to FIG. 17(d) are views for explaining such a conventional method of manufacturing a semiconductor device. FIG. 16(a) to FIG. 16(d) and FIG. 17(a) to FIG. 17(d) are views showing respective steps of the conventional method.

The conventional method of manufacturing a semiconductor device includes, as shown in FIG. 16 (a) to FIG. 16 (d) and FIG. 17(a) to FIG. 17(d), "semiconductor base body forming step", "trench forming step", "heavy metal diffusion step", "glass layer forming step", "glass protection film forming step", "oxide film removing step", "electrode forming step", and "semiconductor base body cutting step" in this order. Hereinafter, the conventional method of manufacturing a semiconductor device is explained in the order of these steps. In this specification, a main surface of the semiconductor base body on a side where trenches are formed is referred to a first main surface, and a main surface of the semiconductor base body on a side opposite to the first main surface is referred to as a second main surface.

(a) Semiconductor base body forming step

Firstly, an $n^+$ type semiconductor layer 914 is formed by diffusion of an n type impurity from a surface of an $n^-$ type semiconductor layer ($n^-$ type silicon substrate) 910 on a second main surface side, and a $p^+$ type semiconductor layer 912 is formed by diffusion of a p type impurity from a surface of the $n^-$ type semiconductor layer 910 on a first main surface side thus forming a semiconductor base body in which a pn junction arranged parallel to a main surface of the semiconductor base body is formed. It may be possible that an $n^-$ type semiconductor layer ($n^-$ type epitaxial layer) is formed on an $n^+$ type semiconductor layer ($n^+$ type silicon substrate) and, thereafter, a $p^+$ type semiconductor layer is formed by diffusion of a p type impurity from a surface of the $n^-$ type semiconductor layer ($n^-$ type epitaxial layer) thus forming a semiconductor base body in which a pn junction arranged parallel to a main surface of the semiconductor base body is formed.

Thereafter, oxide films 916, 918 are formed by thermal oxidation on a surface of the $p^+$ type semiconductor layer 912 and a surface of the $n^+$ type semiconductor layer 914 respectively (see FIG. 16(a)).

(b) Trench forming step

Next, predetermined opening portions are formed on the oxide film 916 at predetermined positions by photo etching. After etching the oxide film, subsequently, the semiconductor base body is etched thus forming trenches 920 having a depth exceeding the pn junction from the surface of the semiconductor base body on the first main surface side (in this case, the trenches 920 having a depth exceeding a boundary surface between the $n^-$ type semiconductor layer 910 and the $n^+$ type semiconductor layer 914) (see FIG. 16 (b)). Along with such formation of the trenches, a pn junction exposure portion A is formed on an inner surfaces of the trench.

(c) Heavy metal diffusion step

Next, a layer 922 which constitutes a heavy metal diffusion source is formed on a surface of the semiconductor base body on a second main surface side in such a manner that the oxide film 918 is removed from the surface of the semiconductor base body on the second main surface side and, thereafter, the layer made of heavy metal (Pt, for example) is formed on the surface of the semiconductor base body on the second main surface side by a sputtering method or by resolving heavy metal (Pt, for example) in solution and applying the solution to the surface of the semiconductor base body on the second main surface side by spinning. Thereafter, heavy metal is thermally diffused at a predetermined temperature so that the carrier recoupling center is formed in the inside of the semiconductor base body (see FIG. 16(c)). The heavy metal diffusion step may be performed prior to the above-mentioned trench forming step.

(d) Glass Layer Forming Step

Next, after removing the layer 922 which constitutes the heavy metal diffusion source, a layer made of the glass composition for protecting a semiconductor junction is formed on an inner surfaces of the trench 920 and a surface of the semiconductor base body in the vicinity of the trench 920 by an electrophoresis method, and the layer made of the glass composition for protecting a semiconductor junction is baked so that a glass layer 926 for passivation is formed on a surface of the trench 920 (see FIG. 16(d)). Here, an oxide film 924 is formed on a surface of the semiconductor base body on a second main surface side.

(e) Glass Protection Film Forming Step

Next, a glass protection film (a glass protection film made of a pitch-based wax, for example) 928 is formed such that the glass protection film 928 covers a surface of the glass layer 926 (see FIG. 17(a)).

(f) Oxide film removing step

Next, the oxide film 916 is etched using the glass protection film 928 as a mask so that the oxide film 916 in an electrode forming region 930 and the oxide film 924 formed on the surface of the semiconductor base body on the second main surface side are removed (see FIG. 17(b)).

(g) Electrode Forming Step

Next, a Ni plating is applied to the semiconductor base body thus forming an anode electrode 932 in the electrode forming region 930 on the surface of the semiconductor base body on the first main surface side and forming a cathode electrode 934 on the surface of the semiconductor base body on the second main surface side (see FIG. 17(c)). The anode electrode and the cathode electrode may be formed by a gas phase method such as vapor deposition or sputtering in place of Ni plating.

(h) Semiconductor Base Body Cutting Step

Next, the semiconductor base body is cut by dicing or the like at a center portion of the glass layer 926 thus dividing the semiconductor base body into a plurality of chips whereby mesa semiconductor devices (pn diodes) 900 are manufactured (see FIG. 17(d)).

As has been explained heretofore, the conventional method of manufacturing a semiconductor device includes the step of forming the trenches 920 exceeding the pn junction on the surface of the semiconductor base body from the first main surface side where the pn junction arranged parallel to the main surface is formed (see FIG. 16(a) and FIG. 16(b)), and the step of forming the glass layer 926 for passivation in the inside of the trench 920 such that the glass layer 926 covers a pn junction exposure portion (see FIG. 16(d)). Accordingly, in the conventional method of manufacturing a semiconductor device, by cutting the semiconductor base body after forming the glass layer 926 for passivation in the inside of the trench 920, mesa semiconductor devices having high reliability can be manufactured.

The conventional method of manufacturing a semiconductor device also includes a step of forming the carrier recoupling center in the inside of the semiconductor base body by thermally diffusing heavy metal from the surface of the semiconductor base body on the second main surface side (see FIG. 16(c)). Accordingly, the conventional method of manufacturing a semiconductor device can manufacture a semiconductor device which exhibits the excellent switching characteristic with a short reverse recovery time trr.

PRIOR ART LITERATURE

Patent Literature

[Patent literature 1] JP-A-2004-87955

SUMMARY OF THE INVENTION

Problems that the Invention is to Solve

A glass material which is used in forming a glass layer for passivation is required to satisfy following conditions (a) to (d), that is, the condition (a) that the glass material can be baked at a proper temperature, the condition (b) that the glass material withstands chemicals used in steps, the condition (c) that the glass material has excellent insulation property and the condition (d) that the glass material does not deteriorate characteristics of the semiconductor device. In view of the above, "a glass material containing lead silicate as a main component" has been widely used conventionally.

However, "the glass material containing lead silicate as a main component" contains lead which imposes a heavy burden on an environment and hence, it is thought that the use of "the glass material containing lead silicate as a main component" will be prohibited in the near future.

Such circumstances exist not only in a method of manufacturing a semiconductor device for manufacturing a mesa semiconductor device but also in a method of manufacturing a semiconductor device having high reliability in general where a glass layer for passivation is formed so as to cover a pn junction exposure portion including a method of manufacturing a semiconductor device for manufacturing a planar-type semiconductor device.

The present invention has been made in view of such circumstances, and it is an object of the present invention to provide a glass composition for protecting a semiconductor junction, a method of manufacturing a semiconductor device and such a semiconductor device which can manufacture a semiconductor device having high reliability using a glass material containing no lead in the same manner as a conventional case where "a glass material containing lead silicate as a main component" is used.

Means for Solving the Task

[1] The present invention is directed to a glass composition for protecting a semiconductor junction used in forming a glass layer which protects a pn junction in a semiconductor element having a pn junction exposure portion where the pn junction is exposed, wherein the glass composition for protecting a semiconductor junction is made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %

[2] In the glass composition for protecting a semiconductor junction according to the present invention, it is preferable that the glass raw material substantially contain no Bi.

[3] In the glass composition for protecting a semiconductor junction according to the present invention, it is preferable that the glass raw material substantially contain no P.

[4] In the glass composition for protecting a semiconductor junction according to the present invention, it is preferable that the glass raw material further contain nickel oxide.

[5] In the glass composition for protecting a semiconductor junction according to the present invention, it is preferable that the glass raw material further contain $ZrO_2$.

[6] In the glass composition for protecting a semiconductor junction according to the present invention, it is preferable that the glass layer be a glass layer which is formed such that the glass layer covers the pn junction exposure portion with an insulation layer interposed therebetween.

[7] In the glass composition for protecting a semiconductor junction according to the present invention, it is preferable that a glass transition temperature Tg fall within a range of from 540° C. to 680° C.

[8] In the glass composition for protecting a semiconductor junction according to the present invention, it is preferable that an average linear expansion coefficient within a temperature range of from 50° C. to 500° C. fall within a range of from $4.5 \times 10^{-6}$ to $5.8 \times 10^{-6}$.

[9] In the glass composition for protecting a semiconductor junction according to the present invention, it is preferable that the content of ZnO fall within a range of from 40 mol % to 56 mol %, the content of $SiO_2$ fall within a range of from 8 mol % to 20 mol %, the content of $B_2O_3$ fall within a range of from 20 mol % to 30 mol %, the content of $Al_2O_3$ fall within a range of from 6 mol % to 10 mol %, and the content of the oxide of an alkaline earth metal fall within a range of from 2 mol % to 5 mol %.

[10] In the glass composition for protecting a semiconductor junction according to the present invention, it is preferable that the semiconductor element be a semiconductor element made of Si.

[11] In the glass composition for protecting a semiconductor junction according to the present invention, it is preferable that the semiconductor element be a fast recovery diode.

[12] In the glass composition for protecting a semiconductor junction according to the present invention, it is preferable that the semiconductor element be a semiconductor element made of SiC.

[13] In the glass composition for protecting a semiconductor junction according to the present invention, it is preferable that the semiconductor element be a semiconductor element made of GaN.

[14] The present invention is also directed to a method of manufacturing a semiconductor device including, in the following order: a first step of preparing a semiconductor element having a pn junction exposure portion where a pn junction is exposed; and a second step of forming a glass layer such that the glass layer covers the pn junction exposure portion, wherein in the second step, the glass layer is formed using a glass composition for protecting a semiconductor junction made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %

[15] In the method of manufacturing a semiconductor device according to the present invention, it is preferable that the second step include a step of forming an insulation film on the pn junction exposure portion, and a step of forming the glass layer such that the glass layer covers the pn junction exposure portion with the insulation film interposed therebetween.

[16] The present invention is also directed to a semiconductor device including: a semiconductor element having a pn junction exposure portion where a pn junction is exposed; and a glass layer which is formed such that the glass layer covers the pn junction exposure portion, wherein the glass layer is formed using a glass composition for protecting a semiconductor junction made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %

[17] In the semiconductor device according to the present invention, it is preferable that the glass layer be formed such that the glass layer covers the pn junction exposure portion with an insulation layer interposed therebetween.

Advantage of the Invention

According to the glass composition for protecting a semiconductor junction, the method of manufacturing a semiconductor device and the semiconductor device of the present invention, as can be clearly understood from examples described later, a semiconductor device having high reliability can be manufactured by using a glass material which contains no lead in the same manner as the conventional case where "a glass material containing lead silicate as a main component" is used.

According to the glass composition for protecting a semiconductor junction, the method of manufacturing a semiconductor device and the semiconductor device of the present invention, the glass layer is formed by baking the layer made of the glass composition for protecting a semiconductor junction which is made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the previously-mentioned contents, and substantially contains none of Pb, As, Sb, Li, Na and K. Due to such composition, a glass transition temperature Tg of the glass composition for protecting the semiconductor junction of the present invention is low, that is, 540° C. to 680° C. Accordingly, as can be clearly understood from examples described later, a baking temperature at which a layer made of the glass composition for protecting a semiconductor junction of the present invention is baked can be set further lower than a baking temperature at which a layer made of a conventional "glass material containing lead silicate as a main component" is baked. For example, the baking temperature at which a layer made of the glass composition for protecting a semiconductor junction is baked can be set to 600° C. to 730° C.

As a result, according to the glass composition for protecting a semiconductor junction, the method of manufacturing a semiconductor device and the semiconductor device of the present invention, even in the manufacture of the semiconductor device where the carrier recoupling center is decreased by annealing in the manufacturing step of the semiconductor element (in the step of baking the glass composition for protecting a semiconductor junction) so that switching characteristic is liable to deteriorate (a fast recovery diode whose reverse recovery time trr is liable to be prolonged, for example), the switching characteristic hardly deteriorates in the manufacturing step of the semiconductor element (in the step of baking the glass composition for protecting a semiconductor junction) thus enabling the manufacture of the semiconductor device having excellent switching characteristic.

As a result, according to the glass composition for protecting a semiconductor junction, the method of manufacturing a semiconductor device and the semiconductor device of the present invention, in the manufacturing step of the semiconductor element (step of baking the glass composition for protecting a semiconductor junction), the glass layer is hardly crystallized thus enabling the manufacture of the semiconductor device having a low reverse leakage current IR. In this case, it is possible to manufacture a semiconductor device having a low reverse leakage current IR in a stable manner even when a background oxide film is not formed between the semiconductor base body and the glass layer (see embodiment 4 and examples 2 to 6 described later).

When the glass composition for protecting a semiconductor junction containing a filler is used as the glass composition for protecting a semiconductor junction, there is a case where at the time of forming a layer made of the glass composition for protecting a semiconductor junction such that the layer covers the pn junction, it is difficult to uniformly form the layer made of the glass composition for protecting a semiconductor junction. That is, when a layer made of the glass composition for protecting a semiconductor junction is formed by an electrophoresis method, it is difficult to uniformly form the layer made of the glass composition for protecting a semiconductor junction due to non-uniform electrophoresis. On the other hand, when a layer made of the glass composition for protecting a semiconductor junction is formed by a spin coating method, a screen printing method or a doctor blade method, there is a case where it is difficult to uniformly form a layer made of the glass composition for protecting a semiconductor junction due to difference in particle size, specific gravity or the like.

To the contrary, according to the glass composition for protecting a semiconductor junction, the method of manufacturing a semiconductor device and the semiconductor device of the present invention, the layer made of the glass composition for protecting a semiconductor junction which contains no filler is used as the glass composition for protecting a semiconductor junction and hence, in forming the layer made of the glass composition for protecting a semiconductor junction such that the layer covers the pn junction, it is possible to uniformly form the layer made of the glass composition for protecting a semiconductor junction.

In the glass composition for protecting a semiconductor junction, the method of manufacturing a semiconductor device and the semiconductor device of the present invention, "to contain at least some specific components ($ZnO$, $SiO_2$ and the like)" means not only the case where the glass composition contains only some specific components but also the case where the glass composition also contains other components which can be usually contained in the glass composition besides some specific components.

In the glass composition for protecting a semiconductor junction, the method of manufacturing a semiconductor device and the semiconductor device of the present invention, "to substantially contain no specific element (Pb, As or the like)" means that the glass composition contains no any such specific element as the component of the glass composition, and does not exclude the glass composition in which the above-mentioned specific element is mixed as an unavoidable impurity in the glass materials which constitute respective components of glass.

In the glass composition for protecting a semiconductor junction, the method of manufacturing a semiconductor device and the semiconductor device of the present invention, "to contain no specific element (Pb, As or the like)" means that the glass composition contains neither an oxide of the specific element nor a nitride or the like of the specific element.

The reason that the glass composition substantially contains no Pb is that the object of the present invention lies in that a semiconductor device having high reliability can be manufactured by using a glass material which contains no lead in the same manner as the conventional case where "a glass material containing lead silicate as a main component" is used.

The reason that the glass composition substantially contains neither As nor Sb is that these components are toxic and hence, there has been the movement to limit the use of these components.

The reason that the glass composition substantially contains none of Li, Na and K is that when the glass composition contains these components, although the glass composition can acquire advantageous effects with respect to an average linear expansion coefficient and a baking temperature, there is a case where the insulation property of the glass composition deteriorates.

BRIEF DESCRIPTION OF THE DRAWINGS

FIG. 11 is a table showing conditions and results of examples.

MODE FOR CARRYING OUT THE INVENTION

Figure 1A:
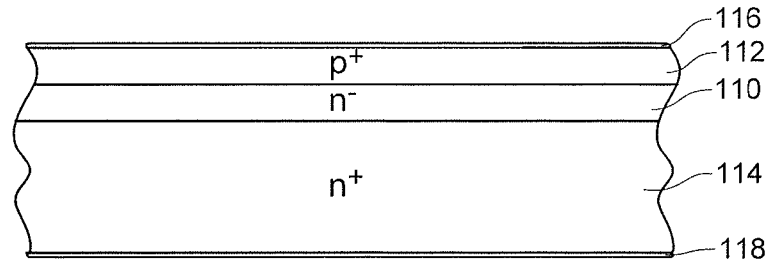
FIG. 1A, FIG. 1B, FIG. 1C, and FIG. 1D are views for explaining a method of manufacturing a semiconductor device according to an embodiment 4.

Hereinafter, a glass composition for protecting a semiconductor junction, a method of manufacturing a semiconductor device and such a semiconductor device according to the present invention are explained in conjunction with embodiments shown in the drawings.

Embodiment 1

The embodiment 1 relates to a glass composition for protecting a semiconductor junction. Particularly, the embodiment 1 is the embodiment which includes glass compositions for protecting a semiconductor junction according to examples 3 to 6 described later.

The glass composition for protecting a semiconductor junction according to the embodiment 1 is a glass composition for protecting a semiconductor junction used in forming a glass layer which protects a pn junction in a semiconductor element having a pn junction exposure portion where the pn junction is exposed, wherein the glass composition for protecting a semiconductor junction is made of fine glass particles prepared from a material in a molten state obtained by melting a glass raw material which contains at least ZnO, $SiO_2$, $B_2O_3$, $Al_2O_3$, at least two oxides of alkaline earth metals selected from a group consisting of BaO, CaO and MgO, $ZrO_2$ and nickel oxide with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %
$ZrO_2$: 0.1 mol % to 3.0 mol %
nickel oxide: 0.01 mol % to 2.0 mol %

In the glass composition for protecting a semiconductor junction according to the embodiment 1, the glass raw material may contain, as an oxide of an alkaline earth metal, all of BaO, CaO and MgO, or two oxides out of BaO, CaO and MgO (BaO and CaO, for example).

In the glass composition for protecting a semiconductor junction according to the embodiment 1, it is preferable that the glass raw material substantially contain none of Bi and P.

In the glass composition for protecting a semiconductor junction according to the embodiment 1, a glass transition temperature Tg falls within a range of from 540° C. to 680° C. Further, in the glass composition for protecting a semiconductor junction according to the embodiment 1, an average linear expansion coefficient within a temperature range of from 50° C. to 500° C. falls within a range of from $4.5\times10^{-6}$ to $5.8\times10^{-6}$.

According to the glass composition for protecting a semiconductor junction according to the embodiment 1, as can be clearly understood from examples described later, a semiconductor device having high reliability can be manufactured by using a glass material which contains no lead in the same manner as the conventional case where "a glass material containing lead silicate as a main component" is used.

The glass composition for protecting a semiconductor junction according to the embodiment 1 is the glass composition for protecting a semiconductor junction which is made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the previously-mentioned contents, and substantially contains none of Pb, As, Sb, Li, Na and K. Due to such composition, a glass transition temperature Tg of the glass composition for protecting the semiconductor junction according to the embodiment 1 is low, that is, 540° C. to 680° C. Accordingly, as can be clearly understood from examples described later, a baking temperature at which a layer made of the glass composition for protecting a semiconductor junction according to the embodiment 1 is baked can be set further lower than a baking temperature at which a layer made of a conventional "glass material containing lead silicate as a main component" is baked. For example, the baking temperature at which a layer made of the glass composition for protecting a semiconductor junction is baked can be set to 600° C. to 730° C.

As a result, according to the glass composition for protecting a semiconductor junction according to the embodiment 1, even in the manufacture of the semiconductor device where the carrier recoupling center is decreased by annealing in the manufacturing step of the semiconductor element (in the step of baking the glass composition for protecting a semiconductor junction) so that switching characteristic is liable to deteriorate (a fast recovery diode whose reverse recovery time trr is liable to be prolonged, for example), the switching characteristic hardly deteriorates in the manufacturing step of the semiconductor element (in the step of baking the glass composition for protecting a semiconductor junction) thus enabling the manufacture of the semiconductor device having excellent switching characteristic.

According to the glass composition for protecting a semiconductor junction according to the embodiment 1, in the manufacturing step of the semiconductor element (step of baking the glass composition for protecting a semiconductor junction), the glass layer is hardly crystallized thus enabling the manufacture of the semiconductor device having a low reverse leakage current IR. Accordingly, it becomes possible to manufacture a semiconductor device having a low reverse leakage current IR in a stable manner even when a background oxide film is not formed between a semiconductor base body and the glass layer (see embodiment 4 and examples 3 to 6 described later).

According to the glass composition for protecting a semiconductor junction according to the embodiment 1, the layer made of the glass composition for protecting a semiconductor junction which contains no filler is used as the glass composition for protecting a semiconductor junction and hence, in forming the layer made of the glass composition for protecting a semiconductor junction such that the layer covers the pn junction, it is possible to uniformly form the layer made of the glass composition for protecting a semiconductor junction.

Among the glass compositions for protecting a semiconductor junction according to the embodiment 1, in the case of the glass compositions for protecting a semiconductor junction including glass compositions for protecting a semiconductor junction of examples 3, 4 and 6 described later, that is, the glass compositions for protecting a semiconductor junction where the content of ZnO falls within a range of from 40 mol % to 56 mol %, the content of $SiO_2$ falls within a range of from 8 mol % to 20 mol %, the content of $B_2O_3$ falls within a range of from 20 mol % to 30 mol %, the content of $Al_2O_3$ falls within a range of from 6 mol % to 10 mol %, and the content of an oxide of an alkaline earth metal falls within a range of from 2 mol % to 5 mol %, the glass transition temperature Tg can be further lowered, that is, 540° C. to 620° C. As can be clearly understood from examples described later, a baking temperature at which a layer made of the glass composition for protecting a semiconductor junction according to the embodiment 1 is baked can be set further lower than a baking temperature at which a layer made of a conventional "glass material containing lead silicate as a main component" is baked. For example, the baking temperature at which a layer made of the glass composition for protecting a semiconductor junction is baked can be set to 600° C. to 730° C.

According to the glass composition for protecting a semiconductor junction according to the embodiment 1, it is possible to set an average linear expansion coefficient of the glass composition for protecting a semiconductor junction within a temperature range of from 50° C. to 500° C. to a value ($4.8\times10^{-6}$ to $5.8\times10^{-6}$, for example) close to a linear expansion coefficient of a semiconductor material (Si, SiC, GaN) (Si: $3.7 \times 10^{-6}$, SiC: $4.4 \times 10^{-6}$, GaN: $5.6 \times 10^{-6}$). Accordingly, the warping of a wafer during steps is decreased and hence, a semiconductor device having an excellent forward characteristic can be manufactured using a thin wafer, while a semiconductor device having an excellent reverse characteristic can be manufactured by increasing a thickness of a glass layer.

The reason the content of ZnO is set to a value which falls within a range of from 30 mol % to 60 mol % is that when the content of ZnO is less than 30 mol %, there is a tendency that a baking temperature needs to be elevated, while when the content of ZnO exceeds 60 mol %, there is a case where the chemical resistance deteriorates or the insulation property is degraded and, further, there is a tendency that the glass composition is liable to be crystallized in the process of vitrification.

The reason the content of $SiO_2$ is set to a value which falls within a range of from 5 mol % to 45 mol % is that when the content of $SiO_2$ is less than 5 mol %, there is a case where the chemical resistance deteriorates or the insulation property is degraded, while when the content of $SiO_2$ exceeds 45 mol %, there is a tendency that a baking temperature needs to be elevated.

The reason the content of $B_2O_3$ is set to a value which falls within a range of from 5 mol % to 30 mol % is that when the content of $B_2O_3$ is less than 5 mol %, there is a tendency that a baking temperature needs to be elevated, while when the content of $B_2O_3$ exceeds 30 mol %, there is a tendency that an average linear expansion coefficient is increased.

The reason the content of $Al_2O_3$ is set to a value which falls within a range of from 5 mol % to 13 mol % is that when the content of $Al_2O_3$ is less than 5 mol %, there is a tendency that the glass composition is liable to be crystallized in the process of vitrification, while when the content of $Al_2O_3$ exceeds 13 mol %, there is a tendency that the insulation property is degraded.

The reason the content of an oxide of an alkaline earth metal is set to a value which falls within a range of from 1 mol % to 10 mol % is that when the content of an oxide of an alkaline earth metal is less than 1 mol %, there is a tendency that a baking temperature needs to be elevated, while when the content of an oxide of an alkaline earth metal exceeds 10 mol %, there is a case where the chemical resistance deteriorates or the insulation property is degraded.

The reason the glass composition contains at least two oxides of an alkaline earth metal as oxides of an alkaline earth metal in this embodiment is that it is possible to lower a baking temperature by making use of an alkali mixing effect (effect that vitrification is facilitated by allowing the composition to contain a plurality of atoms having different atomic radii).

The reason the content of $ZrO_2$ is set to a value which falls within a range of from 0.1 mol % to 3.0 mol % is that when the content of $ZrO_2$ is less than 0.1 mol %, there is a case where the chemical resistance deteriorates or the insulation property is degraded, while when the content of $ZrO_2$ exceeds 3.0 mol %, a melting temperature of glass is increased.

The reason the content of nickel oxide is set to a value which falls within a range of from 0.01 mol % to 2.0 mol % is that when the content of nickel oxide is less than 0.01 mol %, there is a case where it becomes difficult to suppress the generation of bubbles which may be generated from a boundary surface between a "layer made of the glass composition for protecting a semiconductor junction" and a semiconductor substrate in step of baking the "layer made of the glass composition for protecting a semiconductor junction", while when the content of nickel oxide exceeds 2.0 mol %, there is a tendency that the glass composition is liable to be crystallized in the process of vitrification.

The glass composition for protecting a semiconductor junction according to the embodiment 1 can be manufactured as follows. That is, glass raw materials (ZnO, $SiO_2$, $H_3BO_3$, $Al_2O_3$, $BaCO_3$, $CaCO_3$, MgO, $ZrO_2$ and NiO) are prepared at the above-mentioned composition ratio (molar ratio), these glass raw materials are sufficiently mixed and stirred by a mixer and, thereafter, the mixed glass raw material is put into a platinum crucible, and is melted for a predetermined time at a predetermined temperature (1250° C. to 1350° C., for example) in an electric furnace. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus obtaining the powdery glass composition.

The glass composition for protecting a semiconductor junction according to the embodiment 1 is preferably applicable to any one of a semiconductor element made of Si, a semiconductor element made of SiC and a semiconductor element made of GaN.

The glass composition for protecting a semiconductor junction according to the embodiment 1 is preferably applicable to a semiconductor device where a carrier recoupling center is decreased by annealing in the manufacturing step of the semiconductor element (in the step of baking a glass composition for protecting a semiconductor junction) so that a switching characteristic is liable to deteriorate (fast recovery diode whose reverse recovery time trr is liable to be prolonged, for example).

Further, in the glass composition for protecting a semiconductor junction according to the embodiment 1, an average linear expansion coefficient within a temperature range of from 50° C. to 500° C. falls within a range of from $4.5 \times 10^{-6}$ to $5.8 \times 10^{-6}$ and hence, the glass composition for protecting a semiconductor junction according to the embodiment 1 is also preferably applicable to a semiconductor element made of SiC whose average linear expansion coefficient is relatively high (linear expansion coefficient of SiC: $4.4 \times 10^{-6}$) or a semiconductor element made of GaN whose average linear expansion coefficient is relatively high (linear expansion coefficient of GaN: $5.6 \times 10^{-6}$).

Embodiment 2

The embodiment 2 relates to a glass composition for protecting a semiconductor junction. Particularly, the embodiment 2 relates to a glass composition for protecting a semiconductor junction according to an example 1 described later.

The glass composition for protecting a semiconductor junction according to the embodiment 2 basically contains the substantially same components as the glass composition for protecting a semiconductor junction according to the embodiment 1. However, the glass composition for protecting a semiconductor junction according to the embodiment 2 differs from the glass composition for protecting a semiconductor junction according to the embodiment 1 with respect to a point that the glass composition for protecting a semiconductor junction according to the embodiment 2 contains no nickel oxide. That is, the glass composition for protecting a semiconductor junction according to the embodiment 2 which basically contains the substantially same components as the glass composition for protecting a semiconductor junction according to the embodiment 1 is the glass composition for protecting a semiconductor junction made of fine glass particles prepared from a material in a molten state obtained by melting a glass raw material which contains at least ZnO, $SiO_2$, $B_2O_3$, $Al_2O_3$, at least two oxides of alkaline earth metals selected from a group consisting of BaO, CaO and MgO and $ZrO_2$, and substantially contains none of Pb, As, Sb, Li, Na and K. Further, the glass composition for protecting a semiconductor junction contains no filler.

With respect to the content of ZnO, the content of $SiO_2$, the content of $B_2O_3$, the content of $Al_2O_3$, the content of an oxide of an alkaline earth metal and the content of $ZrO_2$, the glass composition for protecting a semiconductor junction according to the embodiment 2 has the same contents as the glass composition for protecting a semiconductor junction according to the embodiment 1.

Further, in the glass composition for protecting a semiconductor junction according to the embodiment 2, in the substantially same manner as the glass composition for protecting a semiconductor junction according to the embodiment 1, a glass transition temperature Tg falls within a range of from 540° C. to 680° C., and an average linear expansion coefficient within a temperature range of from 50° C. to 500° C. falls within a range of from $4.5 \times 10^{-6}$ to $5.8 \times 10^{-6}$.

In this manner, the glass composition for protecting a semiconductor junction according to the embodiment 2 differs from the glass composition for protecting a semiconductor junction according to the embodiment 1 with respect to a point that the glass composition for protecting a semiconductor junction according to the embodiment 2 contains no nickel oxide. However, in the same manner as the glass composition for protecting a semiconductor junction according to the embodiment 1, according to the glass composition for protecting a semiconductor junction according to the embodiment 2, a semiconductor device having high reliability can be manufactured by using a glass material which contains no lead in the same manner as the conventional case where "a glass material containing lead silicate as a main component" is used.

Further, with respect to the content of ZnO, the content of $SiO_2$, the content of $B_2O_3$, the content of $Al_2O_3$, the content of an oxide of an alkaline earth metal and the content of $ZrO_2$, the glass composition for protecting a semiconductor junction according to the embodiment 2 has the same contents as the glass composition for protecting a semiconductor junction according to the embodiment 1. Accordingly, in the same manner as the glass composition for protecting a semiconductor junction according to the embodiment 1, a glass transition temperature Tg of the glass composition for protecting the semiconductor junction according to the embodiment 2 is low, that is, 540° C. to 680° C. and hence, as can be clearly understood from examples described later, a baking temperature at which a layer made of the glass composition for protecting a semiconductor junction according to the embodiment 2 is baked can be set further lower than a baking temperature at which a layer made of a conventional "glass material containing lead silicate as a main component" is baked. For example, the baking temperature at which a layer made of the glass composition for protecting a semiconductor junction is baked can be set to 600° C. to 730° C.

As a result, according to the glass composition for protecting a semiconductor junction according to the embodiment 2, in the same manner as the glass composition for protecting a semiconductor junction according to the embodiment 1, even in the manufacture of the semiconductor device where the carrier recoupling center is decreased by annealing in the manufacturing step of the semiconductor element (in the step of baking the glass composition for protecting a semiconductor junction) so that switching characteristic is liable to deteriorate (a fast recovery diode whose reverse recovery time trr is liable to be prolonged, for example), the switching characteristic hardly deteriorates in the manufacturing step of the semiconductor element (in the step of baking the glass composition for protecting a semiconductor junction) thus enabling the manufacture of the semiconductor device having an excellent switching characteristic.

As a result, according to the glass composition for protecting a semiconductor junction according to the embodiment 2, in the same manner as the glass composition for protecting a semiconductor junction according to the embodiment 1, in the manufacturing step of the semiconductor element (step of baking the glass composition for protecting a semiconductor junction), the glass layer is hardly crystallized thus enabling the manufacture of the semiconductor device having a low reverse leakage current IR (see embodiments 4 and 5 described later).

According to the glass composition for protecting a semiconductor junction according to the embodiment 2, the layer made of the glass composition for protecting a semiconductor junction which contains no filler is used as the glass composition for protecting a semiconductor junction and hence, in forming the layer made of the glass composition for protecting a semiconductor junction such that the layer covers the pn junction, it is possible to uniformly form the layer made of the glass composition for protecting a semiconductor junction.

The glass composition for protecting a semiconductor junction according to the embodiment 2 has the substantially same constitution as the glass composition for protecting a semiconductor junction according to the embodiment 1 except for the point that the glass composition for protecting a semiconductor junction according to the embodiment 2 contains no nickel oxide. Accordingly, the glass composition for protecting a semiconductor junction according to the embodiment also has advantageous effects derived from the same constitution out of the advantageous effects which the glass composition for protecting a semiconductor junction according to the embodiment 1 has.

The reason the content of ZnO, the content of $SiO_2$, the content of $B_2O_3$, the content of $Al_2O_3$, the content of an oxide of an alkaline earth metal and the content of $ZrO_2$ are set to values which fall within the above-mentioned ranges is substantially equal to the reason explained in conjunction with the glass composition for protecting a semiconductor junction according to the embodiment 1.

The reason the glass composition for protecting a semiconductor junction according to the embodiment 2 contains no nickel oxide is that even when the glass composition for protecting a semiconductor junction according to the embodiment 2 contains no a nickel oxide, there is a case where it is possible to suppress the generation of bubbles which may be generated from a boundary surface between a "layer made of the glass composition for protecting a semiconductor junction" and a silicon substrate in step of baking the "layer made of the glass composition for protecting a semiconductor junction".

The glass composition for protecting a semiconductor junction according to the embodiment 2 can be manufactured as follows. That is, glass raw materials (ZnO, $SiO_2$, $H_3BO_3$, $Al_2O_3$, $BaCO_3$, $CaCO_3$, MgO and $ZrO_2$) are prepared at the above-mentioned composition ratio (molar ratio), these glass raw materials are sufficiently mixed and stirred by a mixer and, thereafter, the mixed glass raw material is put into a platinum crucible, and is melted for a predetermined time at a predetermined temperature (1250° C. to 1350° C., for example) in an electric furnace. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus obtaining the powdery glass composition.

In the same manner as the glass composition for protecting a semiconductor junction according to the embodiment 1, the glass composition for protecting a semiconductor junction according to the embodiment 2 is also preferably applicable to any one of a semiconductor element made of Si, a semiconductor element made of SiC and a semiconductor elements made of GaN.

Embodiment 3

The embodiment 3 relates to a glass composition for protecting a semiconductor junction.

The glass composition for protecting a semiconductor junction according to the embodiment 3 basically contains the substantially same components as the glass composition for protecting a semiconductor junction according to the embodiment 1. However, the glass composition for protecting a semiconductor junction according to the embodiment 3 differs from the glass composition for protecting a semiconductor junction according to the embodiment 1 with respect to a point that the glass composition for protecting a semiconductor junction according to the embodiment 3 contains no $ZrO_2$. That is, the glass composition for protecting a semiconductor junction according to the embodiment 3 is the glass composition for protecting a semiconductor junction made of fine glass particles prepared from a material in a molten state obtained by melting a glass raw material which contains at least ZnO, $SiO_2$, $B_2O_3$, $Al_2O_3$, at least two oxides of alkaline earth metals selected from a group consisting of BaO, CaO and MgO and nickel oxide, and substantially contains none of Pb, As, Sb, Li, Na and K. Further, the glass composition for protecting a semiconductor junction contains no filler.

With respect to the glass composition for protecting a semiconductor junction according to the embodiment 3, the content of ZnO, the content of $SiO_2$, the content of $B_2O_3$, the content of $Al_2O_3$, the content of an oxide of an alkaline earth metal and the content of nickel oxide are equal to these contents of the glass composition for protecting a semiconductor junction according to the embodiment 1.

Further, in the glass composition for protecting a semiconductor junction according to the embodiment 3, in the substantially same manner as the glass composition for protecting a semiconductor junction according to the embodiment 1, a glass transition temperature Tg falls within a range of from 540° C. to 680° C., and an average linear expansion coefficient within a temperature range of from 50° C. to 500° C. falls within a range of from $4.5 \times 10^{-6}$ to $5.8 \times 10^{-6}$.

In this manner, the glass composition for protecting a semiconductor junction according to the embodiment 3 differs from the glass composition for protecting a semiconductor junction according to the embodiment 1 with respect to a point that the glass composition for protecting a semiconductor junction according to the embodiment 3 contains no $ZrO_2$. However, in the same manner as the glass composition for protecting a semiconductor junction according to the embodiment 1, according to the glass composition for protecting a semiconductor junction according to the embodiment 3, a semiconductor device having high reliability can be manufactured by using a glass material which contains no lead in the same manner as the conventional case where "a glass material containing lead silicate as a main component" is used.

Further, with respect to the content of ZnO, the content of $SiO_2$, the content of $B_2O_3$, the content of $Al_2O_3$, the content of an oxide of an alkaline earth metal and the content of $ZrO_2$, the glass composition for protecting a semiconductor junction according to the embodiment 2 has the same contents as the glass composition for protecting a semiconductor junction according to the embodiment 1. Accordingly, in the same manner as the glass composition for protecting a semiconductor junction according to the embodiment 1, a glass transition temperature Tg of the glass composition for protecting the semiconductor junction according to the embodiment 3 is low, that is, 540° C. to 680° C. and hence, as can be clearly understood from examples described later, a baking temperature at which a layer made of the glass composition for protecting a semiconductor junction according to the embodiment 3 is baked can be set further lower than a baking temperature at which a layer made of a conventional "glass material containing lead silicate as a main component" is baked. For example, the baking temperature at which a layer made of the glass composition for protecting a semiconductor junction is baked can be set to 600° C. to 730° C.

As a result, according to the glass composition for protecting a semiconductor junction according to the embodiment 3, in the same manner as the glass composition for protecting a semiconductor junction according to the embodiment 1, even in the manufacture of the semiconductor device where the carrier recoupling center is decreased by annealing in the manufacturing step of the semiconductor element (in the step of baking the glass composition for protecting a semiconductor junction) so that switching characteristic is liable to deteriorate (a fast recovery diode whose reverse recovery time trr is liable to be prolonged, for example), the switching characteristic hardly deteriorates in the manufacturing step of the semiconductor element (in the step of baking the glass composition for protecting a semiconductor junction) thus enabling the manufacture of the semiconductor device having excellent switching characteristic.

In the above-mentioned case, according to the glass composition for protecting a semiconductor junction according to the embodiment 3, in the same manner as the glass composition for protecting a semiconductor junction according to the embodiment 1, in the manufacturing step of the semiconductor element (step of baking the glass composition for protecting a semiconductor junction), the glass layer is hardly crystallized thus enabling the manufacture of the semiconductor device having a low reverse leakage current IR. In this case, it is possible to manufacture a semiconductor device having a low reverse leakage current IR in a stable manner even when a background oxide film is not formed between the semiconductor base body and the glass layer (see the embodiment 4 and the example 2 described later).

According to the glass composition for protecting a semiconductor junction according to the embodiment 3, the layer made of the glass composition for protecting a semiconductor junction which contains no filler is used as the glass composition for protecting a semiconductor junction and hence, in forming the layer made of the glass composition for protecting a semiconductor junction such that the layer covers the pn junction, it is possible to uniformly form the layer made of the glass composition for protecting a semiconductor junction.

The glass composition for protecting a semiconductor junction according to the embodiment 3 has the substantially same constitution as the glass composition for protecting a semiconductor junction according to the embodiment 1 except for the point that the glass composition for protecting a semiconductor junction according to the embodiment 3 contains no $ZrO_2$. Accordingly, the glass composition for protecting a semiconductor junction according to the embodiment 3 also has advantageous effects derived from the same constitution out of the advantageous effects which the glass composition for protecting a semiconductor junction according to the embodiment 1 has.

The reason the content of ZnO, the content of $SiO_2$, the content of $B_2O_3$, the content of $Al_2O_3$, the content of an oxide of an alkaline earth metal and the content of nickel oxide are set to values which fall within the above-mentioned ranges is substantially equal to the reason explained in conjunction with the glass composition for protecting a semiconductor junction according to the embodiment 1.

The reason the glass composition for protecting a semiconductor junction according to the embodiment 3 contains no $ZrO_2$ is that there is a case where the glass composition sufficiently exhibits excellent chemical resistance even when the glass composition contains no $ZrO_2$.

The glass composition for protecting a semiconductor junction according to the embodiment 3 can be manufactured as follows. That is, glass raw materials (ZnO, $SiO_2$, $H_2BO_2$, $Al_2O_3$, $BaCO_2$, $CaCO_3$, MgO and NiO) are prepared at the above-mentioned composition ratio (molar ratio), these glass raw materials are sufficiently mixed and stirred by a mixer and, thereafter, the mixed glass raw material is put into a platinum crucible, and is melted for a predetermined time at a predetermined temperature (1250° C. to 1350° C., for example) in an electric furnace. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus obtaining the powdery glass composition.

In the same manner as the glass composition for protecting a semiconductor junction according to the embodiment 1, the glass composition for protecting a semiconductor junction according to the embodiment 3 is also preferably applicable to any one of a semiconductor element made of Si, a semiconductor element made of SiC and a semiconductor element made of GaN.

Embodiment 4

The embodiment 4 relates to a method of manufacturing a semiconductor device.

The method of manufacturing a semiconductor device according to the embodiment 4 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction according to the embodiment 1. The first step includes: a step of preparing a semiconductor base body in which a pn junction arranged parallel to a main surface of the semiconductor base body is formed; and a step of forming trenches having a depth exceeding the pn junction from a surface of a semiconductor base body on a first main surface side thus forming a pn junction exposure portion in the inside of the trench, and the second step includes a step of forming the glass layer such that the glass layer directly covers the pn junction exposure portion in the inside of the trench.

FIG. 1(a) to FIG. 1(d) and FIG. 2(a) to FIG. 2(d) are views for explaining the method of manufacturing a semiconductor device according to the embodiment 4. FIG. 1(a) to FIG. 1(d) and FIG. 2(a) to FIG. 2(d) are views showing respective steps.

The method of manufacturing a semiconductor device according to the embodiment 4 includes, as shown in FIG. 1(a) to FIG. 1(d) and FIG. 2(a) to FIG. 2(d), "semiconductor base body forming step", "trench forming step", "heavy metal diffusion step", "glass layer forming step", "glass protection film forming step", "oxide film removing step", "electrode forming step" and "semiconductor base body cutting step" in this order. Hereinafter, the method of manufacturing a semiconductor device according to the embodiment 4 is explained in the order of these steps.

(a) Semiconductor Base Body Forming Step

Firstly, an $n^+$ type semiconductor layer 114 is formed by diffusion of an n type impurity from a surface of an $n^-$ type semiconductor layer ($n^-$ type silicon substrate) 110 on a second main surface side, and a $p^+$ type semiconductor layer 112 is formed by diffusion of a p type impurity from a surface of the $n^-$ type semiconductor layer 110 on a first main surface side thus forming a semiconductor base body in which a pn junction arranged parallel to a main surface of the semiconductor base body is formed. It may be possible that an $n^-$ type semiconductor layer ($n^-$ type epitaxial layer) is formed on an $n^+$ type semiconductor layer ($n^+$ type silicon substrate) and, thereafter, a $p^+$ type semiconductor layer is formed by diffusion of a p type impurity from a surface of the $n^-$ type semiconductor layer ($n^-$ type epitaxial layer) thus forming a semiconductor base body in which a pn junction arranged parallel to a main surface of the semiconductor base body is formed. Thereafter, oxide films 116, 118 are formed by thermal oxidation on a surface of the $p^+$ type semiconductor layer 112 and a surface of the $n^+$ type semiconductor layer 114 respectively (see FIG. 1(a)).

(b) Trench Forming Step

Next, predetermined opening portions are formed on the oxide film 116 at predetermined positions by photo etching.

Figure 1B:
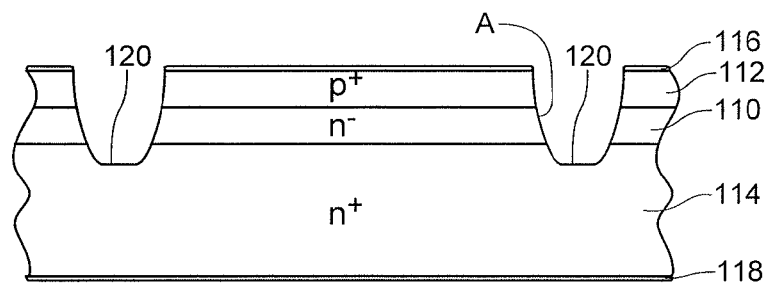
Figure 1C:
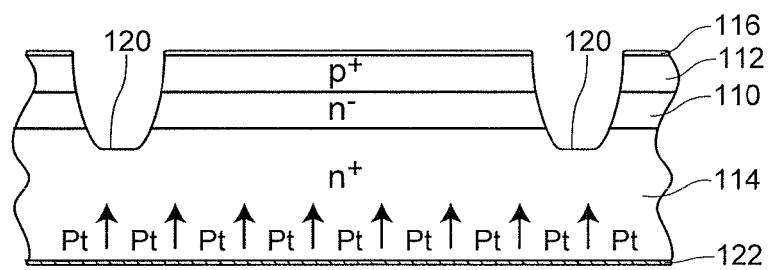

After etching the oxide film, subsequently, the semiconductor base body is etched thus forming trenches 120 having a depth exceeding the pn junction from the surface of the semiconductor base body on the first main surface side (in this case, the trenches 120 having a depth exceeding a boundary surface between the $n^-$ type semiconductor layer 110 and the $n^+$ type semiconductor layer 114) (see FIG. 1(b)). Along with such formation of the trenches, a pn junction exposure portion A is formed on an inner surfaces of the trench.

(c) Heavy Metal Diffusion Step

Next, a layer 122 which constitutes a heavy metal diffusion source is formed on a surface of the semiconductor base body on a second main surface side in such a manner that the oxide film 118 is removed from the surface of the semiconductor base body on the second main surface side and, thereafter, the layer made of heavy metal (Pt, for example) is formed on the surface of the semiconductor base body on the second main surface side by a sputtering method or by resolving heavy metal (Pt, for example) in solution and applying the solution to the surface of the semiconductor base body on the second main surface side by spinning. Thereafter, heavy metal is thermally diffused at a predetermined temperature so that the carrier recoupling center is formed in the inside of the semiconductor base body (see FIG. 1(c)). The heavy metal diffusion step may be performed prior to the above-mentioned trench forming step.

(d) Glass Layer Forming Step

Figure 1D:
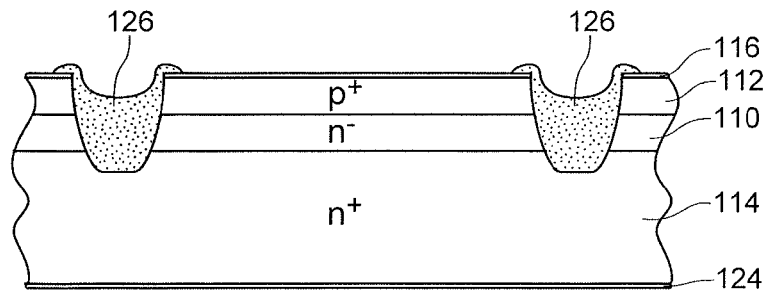

Next, after removing the layer 122 which constitutes the heavy metal diffusion source, a layer made of the glass composition for protecting a semiconductor junction is formed on an inner surfaces of the trench 120 and a surface of the semiconductor base body in the vicinity of the trench 120 by an electrophoresis method, and the layer made of the glass composition for protecting a semiconductor junction is baked so that a glass layer 126 for passivation is formed on a surface of the trench 120 (see FIG. 1(d)). Accordingly, the pn junction exposure portion A in the inside of the trench 120 is brought into a state where the pn junction exposure portion A is directly covered with the glass layer 126. When the layer made of the glass composition for protecting a semiconductor junction is baked, an oxide film 124 is formed on a second main surface side of the semiconductor base body.

(e) Glass Protection Film Forming Step

Figure 2A:
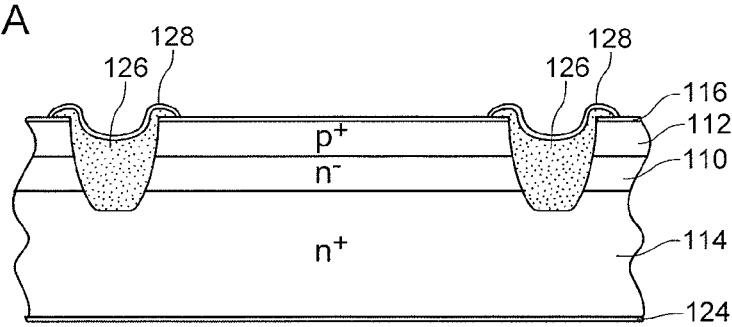
FIG. 2A, FIG. 2B, FIG. 2C, and FIG. 2D are views for explaining the method of manufacturing a semiconductor device according to the embodiment 4.

Next, a glass protection film (a glass protection film made of a pitch-based wax, for example) 128 is formed such that the glass protection film 128 covers a surface of the glass layer 126 (see FIG. 2(a)). Due to the formation of the glass protection film 128, the glass layer 126 is not brought into contact with a Ni plating solution in an electrode forming step described later.

(f) Oxide Film Removing Step

Figure 2B:
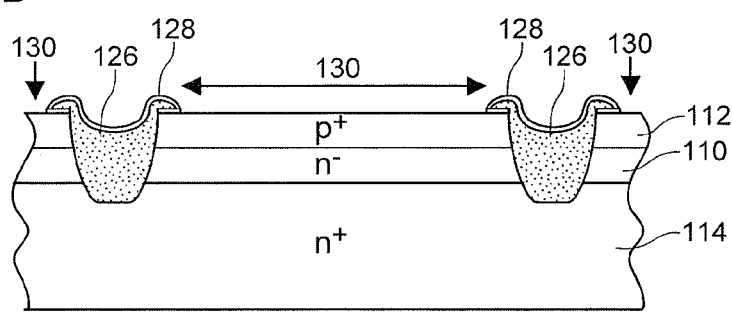

Next, the oxide film 116 is etched using the glass protection film 128 as a mask so that the oxide film 116 in an electrode forming region 130 and the oxide film 124 formed on the surface of the semiconductor substrate on the second main surface side are removed (see FIG. 2(b)).

(g) Electrode forming step

Figure 2C:
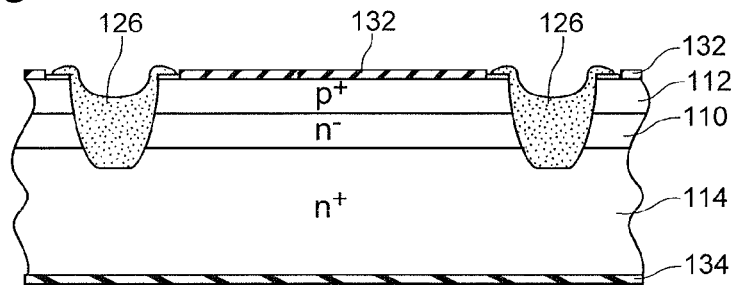

Next, a Ni plating is applied to the semiconductor base body thus forming an anode electrode 132 in the electrode forming region 130 on the surface of the semiconductor base body on the first main surface side and forming a cathode electrode 134 on the surface of the semiconductor base body on the second main surface side (see FIG. 2(c)). The anode electrode and the cathode electrode may be formed by a gas phase method such as vapor deposition or sputtering in place of Ni plating.

(h) Semiconductor base body cutting step

Figure 2D:
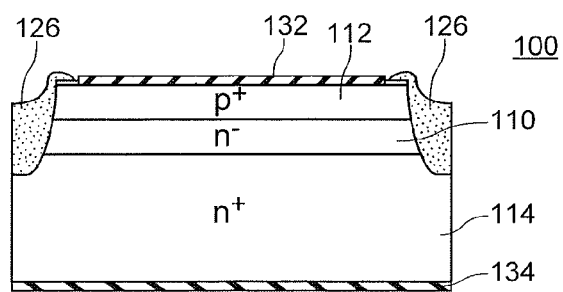

Next, the semiconductor base body is cut by dicing or the like at a center portion of the glass layer 126 thus dividing the semiconductor base body into a plurality of chips whereby mesa semiconductor devices (pn diodes) 100 are manufactured (see FIG. 2(d)).

In the above-mentioned manner, it is possible to manufacture the mesa semiconductor device 100 having high reliability, an excellent switching characteristic, and a low reverse leakage current IR (the semiconductor device 100 according to the embodiment 4).

Embodiment 5

The embodiment 5 relates to a method of manufacturing a semiconductor device.

In the same manner as the method of manufacturing a semiconductor device according to the embodiment 4, the method of manufacturing a semiconductor device according to the embodiment 5 includes, in the following order: a first step of preparing a semiconductor element which includes a pn junction exposure portion where a pn junction is exposed; and a second step of forming a glass layer such that the glass layer covers the pn junction exposure portion. In the second step, different from the method of manufacturing a semiconductor device according to the embodiment 4, the glass layer is formed such that the glass layer covers the pn junction exposure portion with an insulation layer interposed therebetween.

FIG. 3(a) to FIG. 3(d) and FIG. 4(a) to FIG. 4(d) are views for explaining the method of manufacturing a semiconductor device according to the embodiment 5. FIG. 3(a) to FIG. 3(d) and FIG. 4(a) to FIG. 4(d) are views showing respective steps.

The method of manufacturing a semiconductor device according to the embodiment 5 includes, as shown in FIG. 3(a) to FIG. 3(d) and FIG. 4(a) to FIG. 4(d), "semiconductor base body forming step", "trench forming step", "insulation layer forming step", "heavy metal diffusion step", "glass layer forming step", "glass protection film forming step", "oxide film removing step", "electrode forming step", and "semiconductor base body cutting step" in this order. Hereinafter, the method of manufacturing a semiconductor device according to the embodiment 5 is explained in the order of these steps.

(a) Semiconductor base body forming step

Firstly, an $n^+$ type semiconductor layer 114 is formed by diffusion of an n type impurity from a surface of an $n^-$ type semiconductor layer ($n^-$ type silicon substrate) 110 on a second main surface side, and a $p^+$ type semiconductor layer 112 is formed by diffusion of a p type impurity from a surface of the $n^-$ type semiconductor layer 110 on a first main surface side thus forming a semiconductor base body in which a pn junction arranged parallel to a main surface of the semiconductor base body is formed. It may be possible that an $n^-$ type semiconductor layer ($n^-$ type epitaxial layer) is formed on an $n^+$ type semiconductor layer ($n^+$ type silicon substrate) and, thereafter, a $p^+$ type semiconductor layer is formed by diffusion of a p type impurity from a surface of the $n^-$ type semiconductor layer ($n^-$ type epitaxial layer) thus forming a semiconductor base body in which a pn junction arranged parallel to a main surface of the semiconductor base body is formed. Thereafter, oxide films 116, 118 are formed by thermal oxidation on a surface of the $p^+$ type semiconductor layer 112 and a surface of the $n^+$ type semiconductor layer 114 respectively.

(b) Trench Forming Step

Next, predetermined opening portions are formed on the oxide film 116 at predetermined positions by photo etching. After etching the oxide film, subsequently, the semiconductor base body is etched thus forming trenches 120 having a depth exceeding the pn junction from the surface of the semiconductor base body on the first main surface side (in this case, the trenches 120 having a depth exceeding a boundary surface between the $n^-$ type semiconductor layer 110 and the $n^+$ type semiconductor layer 114) (see FIG. 3(a)). Along with such formation of the trenches, a pn junction exposure portion A is formed on an inner surfaces of the trench.

(c) Insulation Layer Forming Step

Figure 3A:
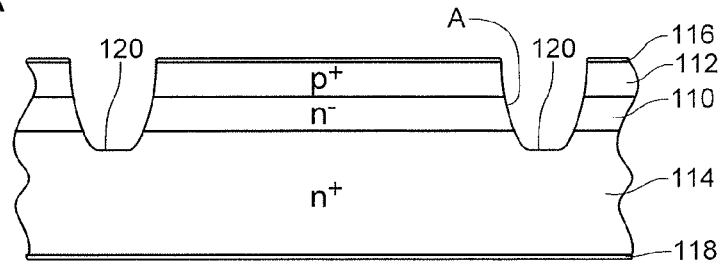
FIG. 3A, FIG. 3B, FIG. 3C, and FIG. 3D are views for explaining a method of manufacturing a semiconductor device according to an embodiment 5.
Figure 3B:
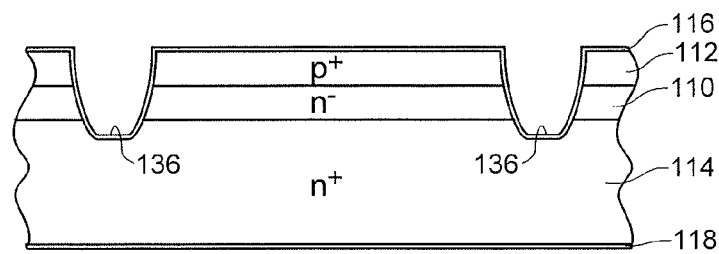
Figure 3C:
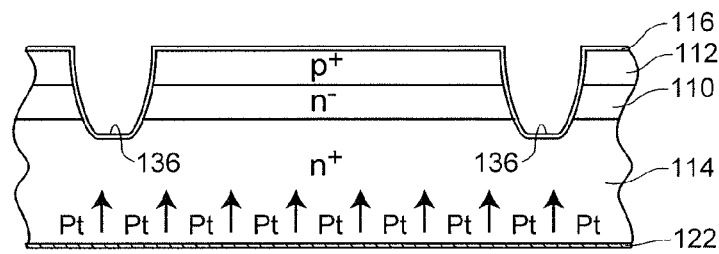

Next, an insulation layer 136 formed of a silicon oxide film is formed on an inner surfaces of the trench 120 by a thermal oxidation method using dry oxygen (DryO$_2$) (see FIG. 3(b)). A thickness of the insulation layer is set to a value which falls within a range of from 5 nm to 60 nm (20 nm, for example). The insulation layer is formed such that a semiconductor substrate is introduced into a diffusion furnace and, thereafter, thermal oxidation treatment is performed at a temperature of 900° C. for 10 minutes while supplying an oxygen gas into the diffusion furnace. When the thickness of the insulation layer 136 is less than 5 nm, there is a case where a reverse current reduction effect cannot be acquired. On the other hand, when the thickness of the insulation layer 136 exceeds 60 nm, there may be a case where a layer made of a glass composition cannot be formed by an electrophoresis method in a next glass layer forming step.

(d) Heavy metal diffusion step

Next, a layer 122 which constitutes a heavy metal diffusion source is formed on a surface of the semiconductor base body on a second main surface side in such a manner that the oxide film 118 is removed from the surface of the semiconductor base body on the second main surface side and, thereafter, the layer made of heavy metal (Pt, for example) is formed on the surface of the semiconductor base body on the second main surface side by a sputtering method or by resolving heavy metal (Pt, for example) in solution and applying the solution to the surface of the semiconductor base body on the second main surface side by spinning. Thereafter, heavy metal is thermally diffused at a predetermined temperature so that the carrier recoupling center is formed in the inside of the semiconductor base body (see FIG. 3(c)). The heavy metal diffusion step may be performed prior to the above-mentioned insulation layer forming step or trench forming step.

(e) Glass Layer Forming Step

Figure 3D:
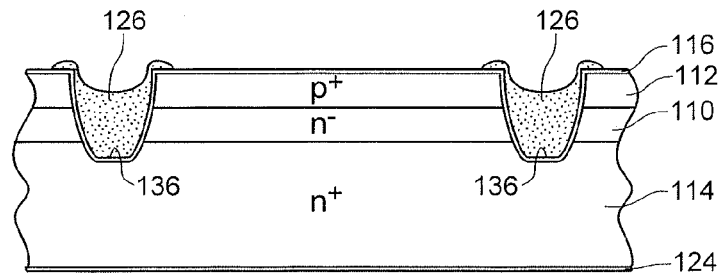

Next, after removing the layer 122 which constitutes the heavy metal diffusion source, a layer made of the glass composition for protecting a semiconductor junction is formed on an inner surfaces of the trench 120 and a surface of the semiconductor base body in the vicinity of the trench 120 by an electrophoresis method, and the layer made of the glass composition for protecting a semiconductor junction is baked so that a glass layer 126 for passivation is formed on a surface of the trench 120 (see FIG. 3(d)). Accordingly, the pn junction exposure portion A in the inside of the trench 120 is brought into a state where the pn junction exposure portion A is covered with the glass layer 126 with the insulation layer 136 interposed therebetween. Here, when the layer made of the glass composition for protecting a semiconductor junction is baked, an oxide film 124 is formed on a second main surface side of the semiconductor base body.

(f) Glass Protection Film Forming Step

Figure 4A:
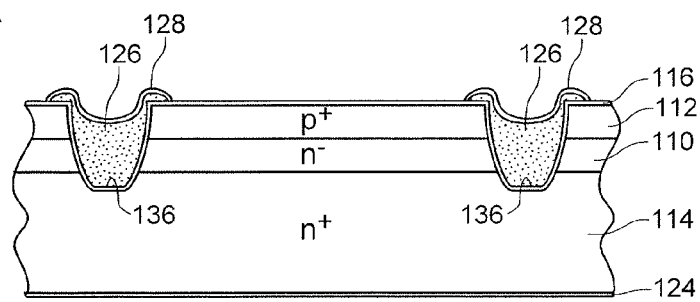
FIG. 4A, FIG. 4B, FIG. 4C, and FIG. 4D are views for explaining the method of manufacturing a semiconductor device according to the embodiment 5.

Next, a glass protection film (a glass protection film made of a pitch-based wax, for example) 128 is formed such that the glass protection film 128 covers a surface of the glass layer 126 (see FIG. 4(a)). Due to the formation of the glass protection film 128, the glass layer 126 is not brought into contact with a Ni plating solution in an electrode forming step described later.

(g) Oxide Film Removing Step

Figure 4B:
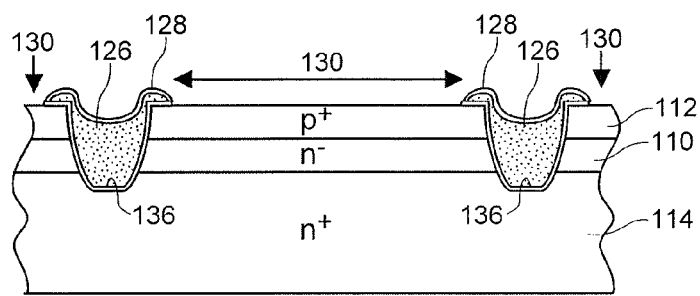

Next, the oxide film 116 is etched using the glass protection film 128 as a mask so that the oxide film 116 formed in an electrode forming region 130 and the oxide film 124 formed on the surface of the semiconductor substrate on the second main surface side are removed (see FIG. 4(b)).

(h) Electrode Forming Step

Figure 4C:
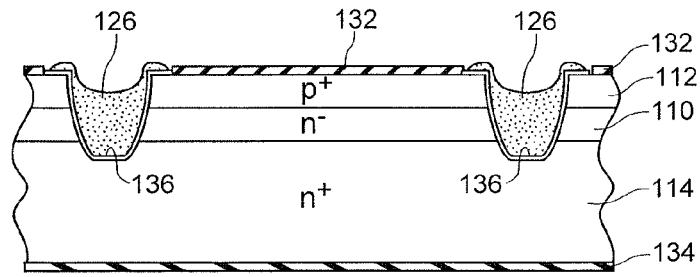

Next, a Ni plating is applied to the semiconductor base body thus forming an anode electrode 132 in the electrode forming region 130 on the surface of the semiconductor base body on the first main surface side and forming a cathode electrode 134 on the surface of the semiconductor base body on the second main surface side (see FIG. 4(c)). The anode electrode and the cathode electrode may be formed by a gas phase method such as vapor deposition or sputtering in place of Ni plating.

(i) Semiconductor Base Body Cutting Step

Figure 4D:
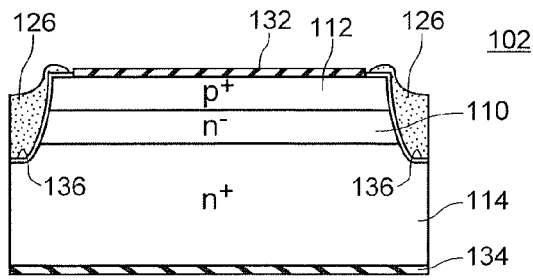

Next, the semiconductor base body is cut by dicing or the like at a center portion of the glass layer 126 thus dividing the semiconductor base body into a plurality of chips whereby mesa semiconductor devices (pn diodes) 102 are manufactured (see FIG. 4(d)).

In the above-mentioned manner, it is possible to manufacture a mesa semiconductor device 102 having high reliability, an excellent switching characteristic, and a low reverse leakage current IR (the semiconductor device 102 according to the embodiment 5).

Embodiment 6

The embodiment 6 relates to a method of manufacturing a semiconductor device.

In the same manner as the method of manufacturing a semiconductor device according to the embodiment 4, the method of manufacturing a semiconductor device according to the embodiment 6 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction according to the embodiment 1. However, different from the method of manufacturing a semiconductor device according to the embodiment 4, in the embodiment 6, the first step includes a step of forming a pn junction exposure portion on a surface of a semiconductor base body, and the second step includes a step of forming the glass layer such that the glass layer covers the pn junction exposure portion on the surface of the semiconductor base body.

FIG. 5(a) to FIG. 5(d) and FIG. 6(a) to FIG. 6(c) are views for explaining the method of manufacturing a semiconductor device according to the embodiment 6. FIG. 5(a) to FIG. 5(d) and FIG. 6(a) to FIG. 6(c) are views showing respective steps.

In the method of manufacturing the semiconductor device according to the embodiment 6, as shown in FIG. 5(a) to FIG. 5(d) and FIG. 6(a) to FIG. 6(c), "semiconductor base body preparing step", "p$^+$ type semiconductor layer forming step", "n$^+$ type semiconductor layer forming step", "heavy metal diffusion step", "glass layer forming step", "glass layer etching step", "electrode forming step" and "semiconductor base body cutting step" are carried out in this order. Hereinafter, the method of manufacturing a semiconductor device according to the embodiment 6 is explained in the order of these steps.

(a) Semiconductor Base Body Preparing Step

Figure 5A:
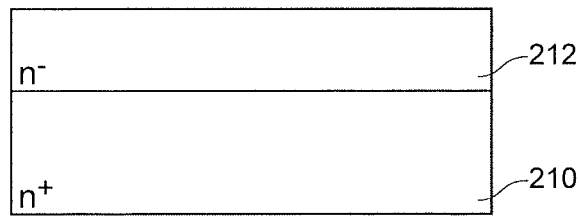
FIG. 5A, FIG. 5B, FIG. 5C, and FIG. 5D are views for explaining a method of manufacturing a semiconductor device according to an embodiment 6.
Figure 5B:
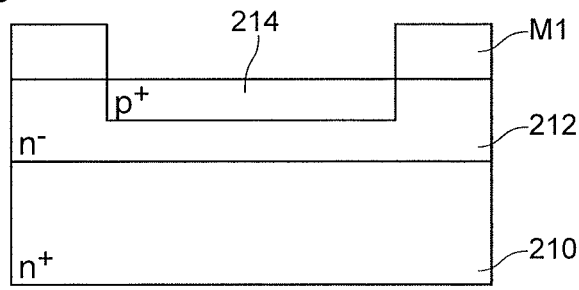
Figure 5C:
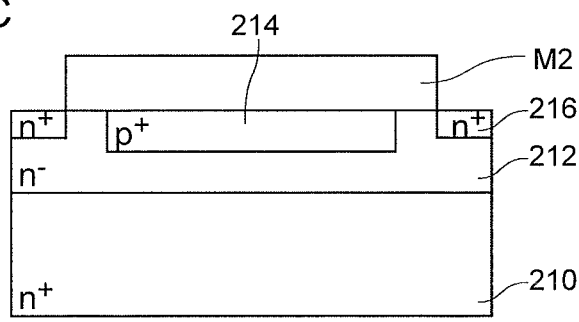
Figure 5D:
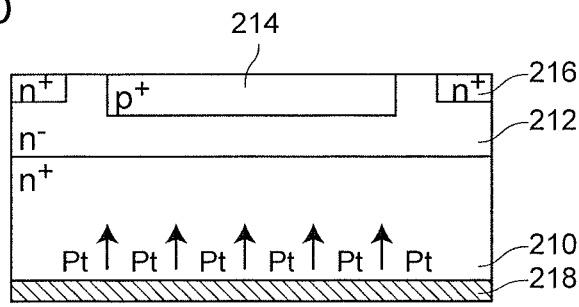

Firstly, a semiconductor base body where an n$^-$ type semiconductor layer (n$^-$ type epitaxial layer) 212 is laminated on an n$^+$ type semiconductor layer (n$^+$ type silicon substrate) 210 is prepared (see FIG. 5(a)).

(b) p$^+$ Type Semiconductor Layer Forming Step

Next, after forming a mask M1 on the n type semiconductor layer 212, a p type impurity (boron ion, for example) is implanted into a predetermined region on a surface of the n$^-$ type semiconductor layer 212 by an ion implantation method using the mask M1. Then, a p$^+$ type semiconductor layer 214 is formed by thermal diffusion (see FIG. 5(b)).

(c) n$^+$ Type Semiconductor Layer Forming Step

Next, the mask M1 is removed from the n$^-$ type semiconductor layer 212 and a mask M2 is formed on the n$^-$ type semiconductor layer 212. Thereafter, an n type impurity (arsenic ion, for example) is implanted into a predetermined region on the surface of the n$^-$ type semiconductor layer 212 by an ion implantation method using the mask M2. Then, an n$^+$ type semiconductor layer 216 is formed by thermal diffusion (see FIG. 5(c)).

(d) Heavy Metal Diffusion Step

Next, a layer 218 which constitutes a heavy metal diffusion source is formed on a surface of the semiconductor base body on a second main surface side in such a manner that the mask M2 is removed and, thereafter, the layer made of heavy metal (Pt, for example) is formed on the surface of the semiconductor base body on the second main surface side by a sputtering method or by resolving heavy metal (Pt, for example) in solution and applying the solution to the surface of the semiconductor base body on the second main surface side by spinning. Thereafter, heavy metal is thermally diffused at a predetermined temperature so that the carrier recoupling center is formed in the inside of the semiconductor base body (see FIG. 5(d)).

(e) Glass Layer Forming Step

Next, after removing the layer 218 which constitutes the heavy metal diffusion source, a layer made of the glass composition for protecting a semiconductor junction is formed on a surface of the n⁻ type semiconductor layer 212 using a paste obtained by mixing the glass composition for protecting a semiconductor junction according to the embodiment 1 and an organic binder by a spin coating method. Thereafter, the layer made of the glass composition for protecting a semiconductor junction is baked thus forming a glass layer 220 for passivation (see FIG. 6(a)).

(f) Glass Layer Etching Step

Figure 6A:
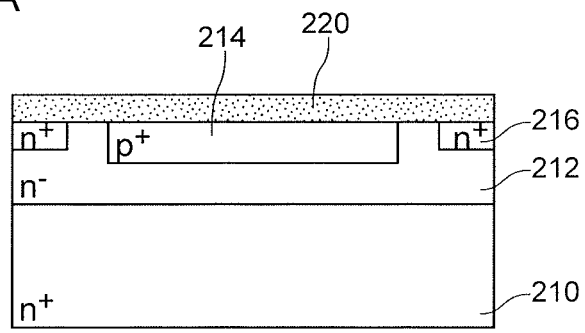
FIG. 6A, FIG. 6B, and FIG. 6C are views for explaining the method of manufacturing a semiconductor device according to the embodiment 6.
Figure 6B:
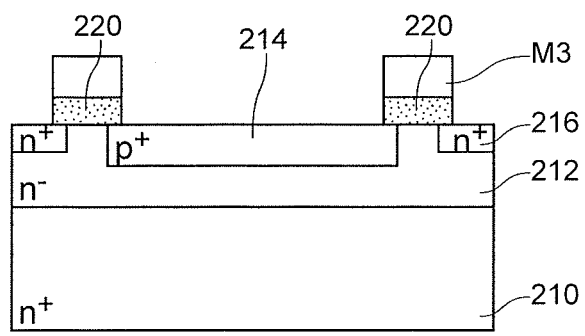

Next, after forming a mask M3 in a predetermined region on the surface of the glass layer 220, the glass layer is etched (see FIG. 6(b)). Due to such etching, the glass layer 220 is formed in the predetermined region on the surface of the n⁻ type semiconductor layer 212.

(g) Electrode Forming Step

Figure 6C:
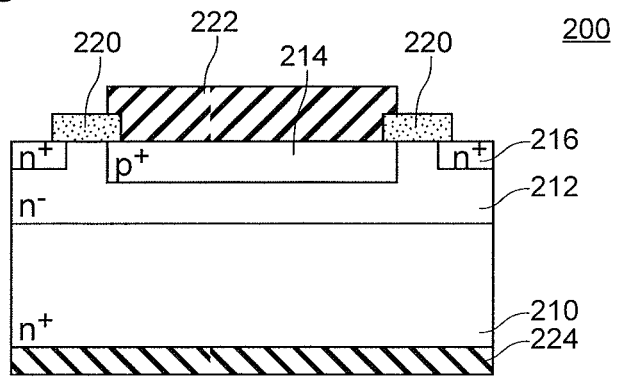

Next, the mask M3 is removed from the surface of the glass layer 220 and, thereafter, an anode electrode 222 is formed in a region on the surface of the semiconductor base body surrounded by the glass layer 220, and a cathode electrode 224 is formed on a back surface of the semiconductor base body (see FIG. 6(c)).

(h) Semiconductor Base Body Cutting Step

Next, the semiconductor base body is cut by dicing or the like thus dividing the semiconductor base body into a plurality of chips whereby semiconductor devices (planar-type pn diodes) 200 are manufactured (not shown in the drawing).

In the above-mentioned manner, it is possible to manufacture a planar-type semiconductor device 200 having high reliability (the semiconductor device according to the embodiment 6).

Embodiment 7

The embodiment 7 relates to a method of manufacturing a semiconductor device.

In the same manner as the method of manufacturing a semiconductor device according to the embodiment 6, the method of manufacturing a semiconductor device according to the embodiment 7 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction according to the embodiment 1. However, different from the method of manufacturing a semiconductor device according to the embodiment 6, in the embodiment 7, a semiconductor base body made of SiC is used in place of a semiconductor base body made of Si as the semiconductor base body.

FIG. 7(a) to FIG. 10 (c) are views for explaining the method of manufacturing a semiconductor device according to the embodiment 7. FIG. 7(a) to FIG. 7(c), FIG. 8 (a) to FIG. 8(c), FIG. 9(a) to FIG. 9(c) and FIG. 10(a) to FIG. 10(c) are views showing respective steps.

In the method of manufacturing the semiconductor device according to the embodiment 7, as shown in FIG. 7(a) to FIG. 10(c), "semiconductor base body preparing step", "guard ring layer forming step", "impurity activation step", "back surface Ni ohmic layer forming step", "glass layer forming step", "glass layer etching step", "barrier metal layer and anode electrode layer forming step", "cathode electrode layer forming step" and "semiconductor base body cutting step" are carried out in this order. Hereinafter, the method of manufacturing a semiconductor device according to the embodiment 7 is explained in the order of these steps.

(a) Semiconductor Base Body Preparing Step

A semiconductor base body 310 which is constituted of: an n' type semiconductor layer (n' type silicon carbide single crystal substrate) 312 (thickness: 400 µm, impurity (nitrogen) concentration: $1\times10^{19}$ cm$^{-3}$); and an n⁻ type semiconductor layer (n⁻ type epitaxial layer/drift layer) 314 (thickness: 5 µm, impurity (nitrogen) concentration: $5\times10^{15}$ cm$^{-3}$) made of silicon carbide and formed on an upper surface of the n⁺ type semiconductor layer 312 is prepared (see FIG. 7(a)).

(b) Guard Ring Layer Forming Step

Next, a surface of the semiconductor base body 310 is cleaned and, thereafter, a silicon oxide mask M4 having an opening at a portion corresponding to a guard ring layer 316 is formed on a surface of the n⁻ type semiconductor layer 314. Then, aluminum ions which constitute p type impurities are implanted into predetermined portion of the n⁻ type semiconductor layer 314 using the silicon oxide mask M4 thus forming a p type impurity introduced layer 315 (depth: 0.7 µm, p type impurity concentration: $1\times10^{17}$ cm$^{-3}$) (see FIG. 7(b)). Aluminum ions are implanted such that aluminum ions are implanted into the surface of the n⁻ type semiconductor layer 314 in multiple stages with different energies (30 kev, 60 kev, . . . , 700 kev). In the guard ring layer forming step, aluminum ions may be implanted under a condition where a thin silicon oxide film or the like is present in the opening formed in the mask M4.

(c) Impurity Activation Annealing Step

Figure 7A:
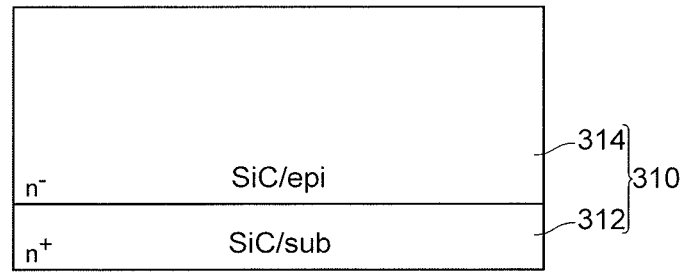
FIG. 7A, FIG. 7B, and FIG. 7C are views for explaining a method of manufacturing a semiconductor device according to an embodiment 7.
Figure 7B:
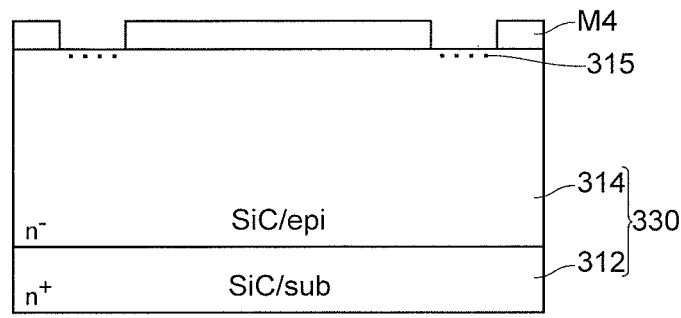
Figure 7C:
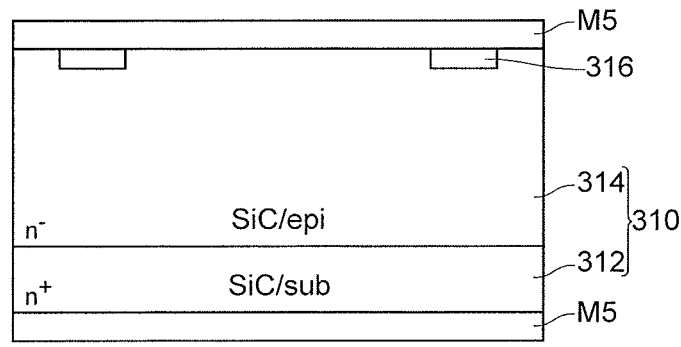
Figure 8A:
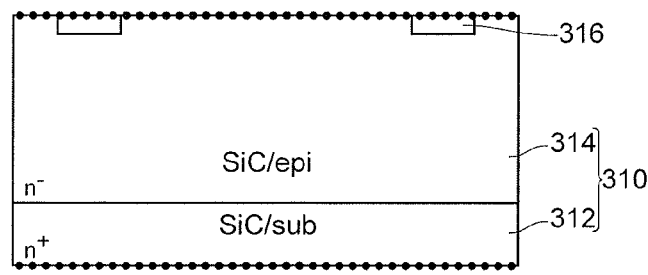
FIG. 8A, FIG. 8B, and FIG. 8C are views for explaining the method of manufacturing a semiconductor device according to the embodiment 7.
Figure 8B:
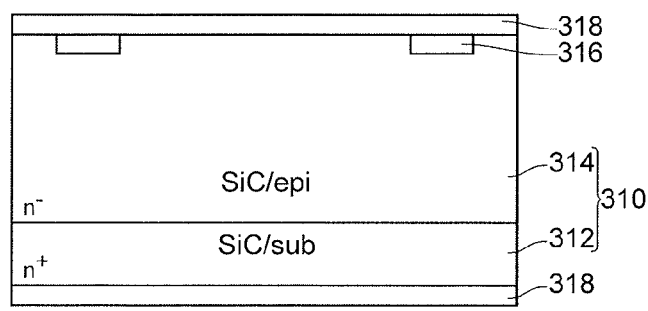
Figure 8C:
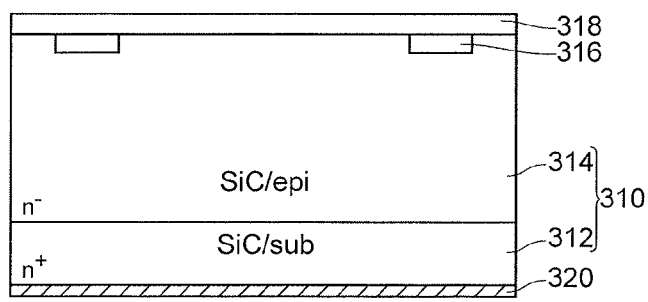

Next, the mask M4 is removed and, thereafter, a protective resist layer M5 is formed on the surface (first main surface) and a back surface (second main surface) of the semiconductor base body 310 respectively (see FIG. 7(c)), and the semiconductor base body 310 is heated to a temperature of 1600° C. or above so as to activate p-type impurities. Then, the surface and back surface of the semiconductor base body 310 which are made coarse in this step (see FIG. 8(a)) are subject to sacrificial oxidation in an oxygen atmosphere at a temperature of 1000° C. or above so that a sacrificial oxide film 318 is formed (see FIG. 8(b)).

(d) Back Surface Ni Ohmic Layer Forming Step

Next, the sacrificial oxide film 318 on the back surface of the semiconductor base body 310 is removed and, thereafter, a nickel layer (thickness: 50 nm) is formed on the back surface of the semiconductor base body 310. Then, the semiconductor base body 310 is annealed at a temperature of 950° C. thus forming a Ni ohmic layer 320 on the back surface of the semiconductor base body 310 (see FIG. 8(c)).

(e) Glass Layer Forming Step

Figure 9A:
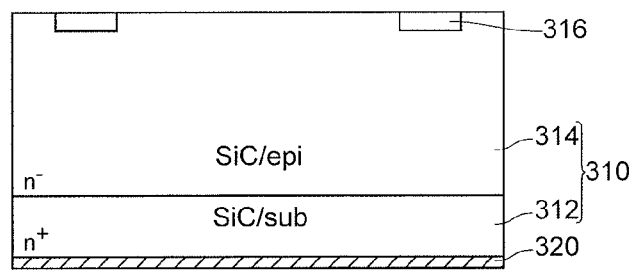
FIG. 9A, FIG. 9B, and FIG. 9C are views for explaining the method of manufacturing a semiconductor device according to the embodiment 7.
Figure 9B:
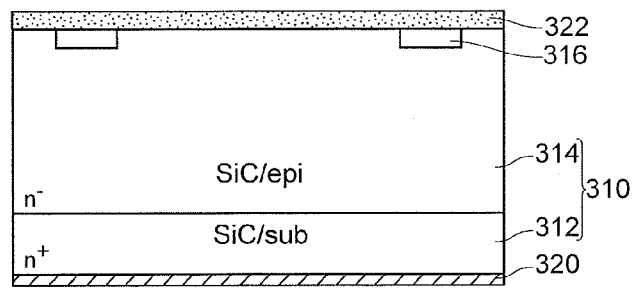

Next, after removing the sacrificial oxide film 318 formed on the surface of the semiconductor base body 310 (see FIG. 9(a)), a layer made of the glass composition for protecting a semiconductor junction is formed on a surface of the semiconductor base body 310 using a paste obtained by mixing the glass composition for protecting a semiconductor junction according to the embodiment 1 and an organic binder by a spin coating method. Then, the layer made of the glass composition for protecting a semiconductor junction is baked thus forming a glass layer 322 for passivation (see FIG. 9(b)).

(f) Glass Layer Etching Step

Figure 9C:
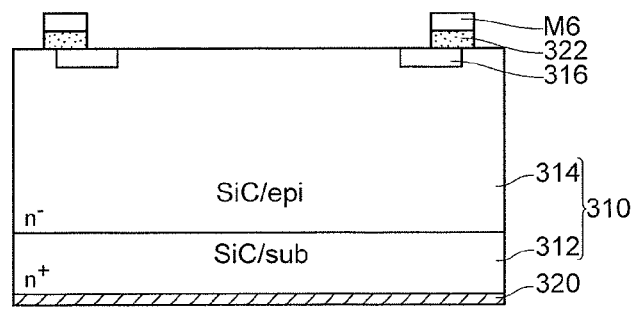

Next, after forming a mask M6 on the surface of the glass layer 322, the glass layer 322 is etched (see FIG. 9(c)). Due to such etching, the glass layer 322 is formed in a predetermined region on the surface of the semiconductor base body 310 (see FIG. 10(a)).

(g) Barrier Metal Layer and Anode Electrode Layer Forming Step

Figure 10A:
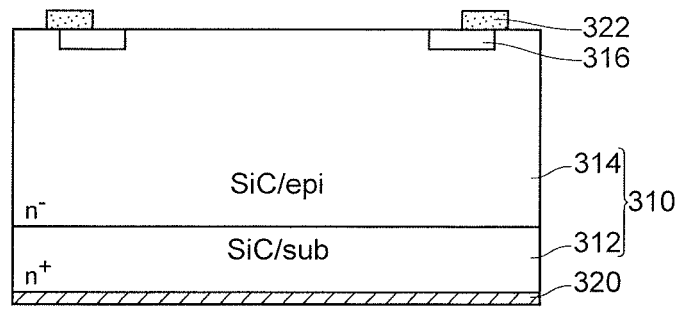
FIG. 10A, FIG. 10B, and FIG. 10C are views for explaining the method of manufacturing a semiconductor device according to the embodiment 7.
Figure 10B:
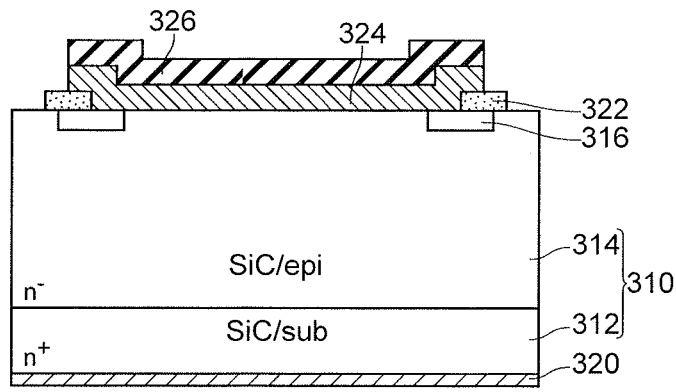

Then, on the surface of the semiconductor base body 310, a titanium layer (100 nm) which constitutes barrier metal and an aluminum layer (2000 nm) which constitutes a surface electrode are sequentially formed by vapor deposition and, thereafter, etching is performed thus forming a barrier metal layer 324 and an anode electrode layer 326 (see FIG. 10(b)).

(h) Cathode Electrode Layer Forming Step

Then, a cathode electrode layer 328 which is a lamination film formed by laminating a titanium layer, a nickel layer and a silver layer to each other is formed on the back surface of the semiconductor base body 310.

(i) Semiconductor Base Body Cutting Step

Figure 10C:
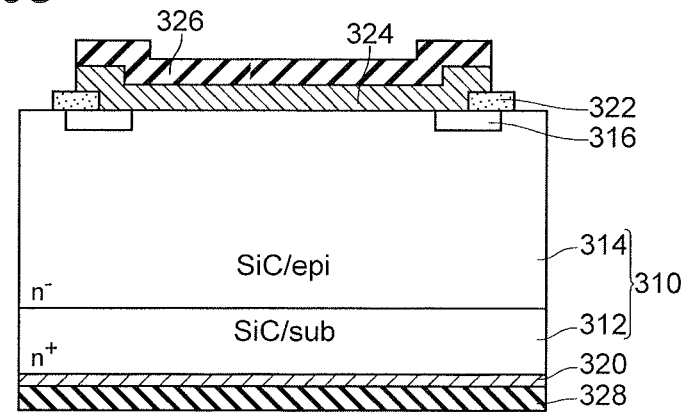

Then, the semiconductor base body is cut by dicing or the like thus dividing the semiconductor base body into a plurality of chips whereby semiconductor devices (planar-type Schottky-barrier diodes) 300 are manufactured (see FIG. 10(c)).

In the above-mentioned manner, it is possible to manufacture a planar-type semiconductor device 300 having high reliability (the semiconductor device according to the embodiment 7).

EXAMPLES

1. Preparation of Specimens

FIG. 11 is a table showing conditions and results of examples. Glass raw materials are prepared to have composition ratios indicated in examples 1 to 6 and comparison examples 1 and 2 (see FIG. 11). The glass raw materials are sufficiently mixed by a mixer and, thereafter, the mixed glass raw material is put into a platinum crucible and is melted in an electric furnace for two hours at a predetermined temperature (examples 1 to 6: 1250° C. to 1350° C., comparison examples 1 and 2: 1500° C. to 1550° C.). Then, the material in a molten state is made to flow out from the crucible and is fed to water-cooled rolls so that glass flakes in a flaky shape are obtained. The glass flakes are pulverized by a ball mill until the glass flakes obtain an average particle size of 5 μm thus producing powdery glass composition.

The glass raw materials used in the examples are ZnO, $SiO_2$, $H_3BO_3$, $Al_2O_3$, $BaCO_3$, $CaCO_3$, MgO, $ZrO_2$, NiO and PbO.

2. Evaluation

The respective glass compositions obtained by the above-mentioned methods are evaluated by the following evaluation aspects.

(1) Evaluation Aspect 1 (Environmental Burden)

The object of the present invention lies in that a semiconductor device having high reliability can be manufactured by using a glass material which contains no lead in the same manner as the conventional case where "a glass material containing lead silicate as a main component" is used and hence, the score "good" is given when the glass composition contains no lead component, and the score "bad" is given when the glass composition contains a lead component.

(2) Evaluation Aspect 2 (Baking Temperature)

When the baking temperature is excessively high, there is a tendency that a reverse leakage current IR is increased along with the increase of a reverse recovery time trr. Accordingly, the score "good" is given when the baking temperature is equal to or below 760° C., the score "fair" is given when the baking temperature falls within a range of from 760° C. to 1100° C., and the score "bad" is given when the baking temperature exceeds 1100° C.

(3) Evaluation Aspect 3 (Chemical Resistance)

The score "good" is given when the glass composition exhibits insolubility to both aqua regia and plating solution, the score "fair" is given when the glass composition exhibits slight solubility to at least one of aqua regia and plating solution, and the score "bad" is given when the glass composition exhibits solubility to at least one of aqua regia and plating solution.

In the cases of the glass compositions for protecting a semiconductor junction according to the examples 1 to 6, each glass composition contains ZnO at high concentration so that the glass composition is slightly dissolved in Ni plating solution. Accordingly, the score "fair" is given with respect to the glass compositions for protecting a semiconductor junction according to the examples 1 to 6. However, even in these cases, by performing the Ni plating in a state where the glass protection film is formed so as to cover a surface of the glass layer, the glass layer is not brought into contact with the Ni plating solution and hence, there arises no serious problem.

(4) Evaluation Aspect 4 (Presence or Non-Presence of Crystallization)

A semiconductor device (pn diode) is manufactured by a method substantially equal to the method of manufacturing a semiconductor device according to the embodiment 4. As a result of the manufacture, the score "good" is given when the vitrification is achieved without causing crystallization in the step of vitrification of a layer made of a glass composition, and the score "bad" is given when the vitrification is not achieved due to crystallization in the step of vitrification of the layer made of the glass composition.

(5) Evaluation Aspect 5 (Presence or Non-Presence of Generation of Bubbles)

A semiconductor device (pn diode) is manufactured by a method substantially equal to the method of manufacturing a semiconductor device according to the embodiment 4, and the observation is made whether or not bubbles are generated in the inside of the glass layer 126 (particularly, in the vicinity of a boundary surface between the glass layer 126 and the silicon substrate) in the step of vitrification (preliminary evaluation). Further, layers made of the glass compositions for protecting a semiconductor junction are formed on silicon substrates each having a size of 10 mm square respectively by applying by coating the glass compositions for protecting a semiconductor junction according to the examples 1 to 6 and the comparison examples 1 and 2, and the layers made of the glass compositions for protecting a semiconductor junction are baked thus forming the glass layers. Then, the observation is made whether or not bubbles are generated in the inside of the glass layers (particularly, in the vicinity of the boundary surface between the glass layer and the semiconductor base body) (subsequent evaluation).

Figure 12A:
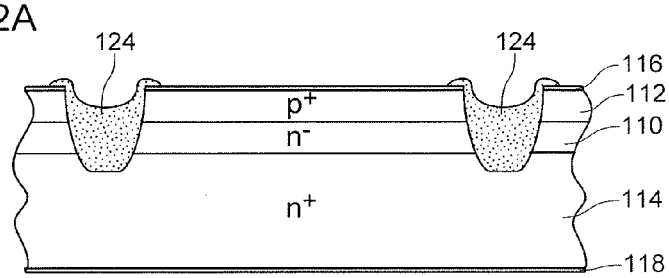
FIG. 12A and FIG. 12B are views for explaining bubbles b generated in the inside of a glass layer 126 in a preliminary evaluation.
Figure 12B:
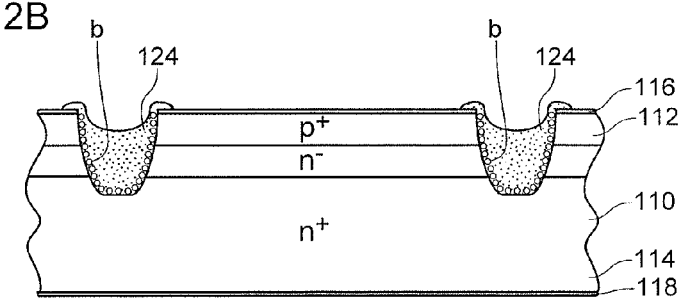
Figure 13A:
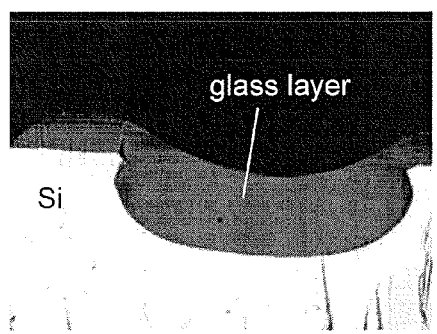
FIG. 13A and FIG. 13B are Photographs for explaining bubbles b generated in the inside of the glass layer 126 in a subsequent evaluation.
Figure 13B:
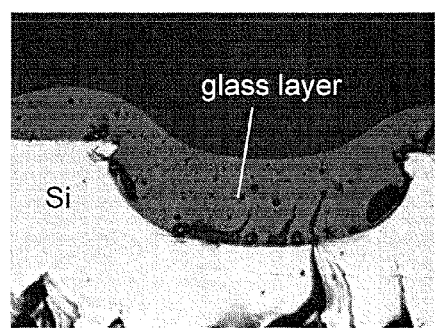

FIG. 12(a) and FIG. 12 (b) are views for explaining bubbles b generated in the inside of the glass layer 126 in the preliminary evaluation. FIG. 12(a) is a cross-sectional view of a semiconductor device when no bubbles bare generated, while FIG. 12(b) is a cross-sectional view of a semiconductor device when the bubbles b are generated. FIG. 13(a) and FIG. 13(b) are photographs for explaining the bubbles b generated in the inside of the glass layer 126 in the subsequent evaluation. FIG. 13(a) is a photograph showing a boundary surface between the semiconductor base body and the glass layer when no bubbles are generated in an enlarged manner, while FIG. 13(b) is a photograph showing a boundary surface between the semiconductor base body and the glass layer when the bubbles are generated in an enlarged manner. As a result of the experiment, it is found that there is favorable correlation between the result of the preliminary evaluation and the result of the evaluation of the present invention. In the subsequent evaluation, the score "good" is given when no bubble having a diameter of 50 μm or more is generated in the inside of the glass layer, the score "fair" is given when one to twenty bubbles having a diameter of 50 mm or more are generated in the inside of the glass layer, and the score "bad" is given when twenty one or more bubbles having a diameter of 50 μm or more are generated in the inside of the glass layer.

In the case of the glass composition for protecting a semiconductor junction according to the example 1, the glass composition contains no nickel oxide so that a slight amount of bubbles is generated whereby the score "fair" is given. However, even in the case where the glass composition contains no nickel oxide, by manufacturing a semiconductor device by a method substantially equal to the method of manufacturing a semiconductor device according to the embodiment 5 (that is, the method of manufacturing a semiconductor device where a glass layer is formed on a pn junction surface with an insulation layer interposed therebetween), no bubbles are generated.

(6) Evaluation Aspect 6 (Reverse Leakage Current)

Figure 14:
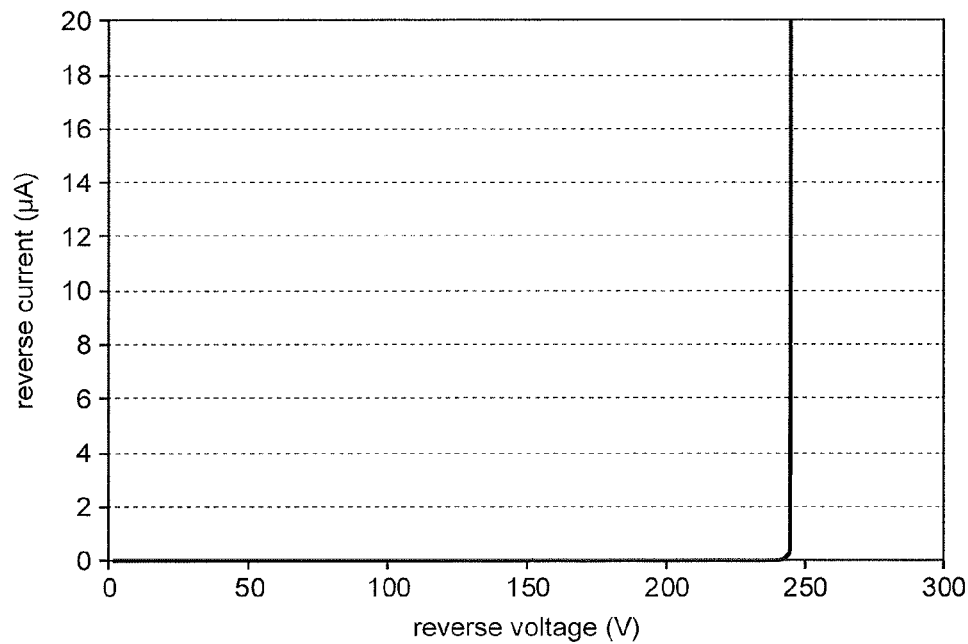
FIG. 14 is a graph showing a reverse current in a semiconductor device which is manufactured using a glass composition for protecting a semiconductor junction according to an example 3.

A semiconductor device (pn diode) is prepared by a method substantially equal to the method of manufacturing a semiconductor device according to the embodiment 4, and a reverse characteristic of the prepared semiconductor device is measured. FIG. 14 is a graph showing a reverse leakage current in the semiconductor device which is prepared using the glass composition for protecting a semiconductor junction according to the example 3. As the result of the measurement, the score "good" is given in the case where a reverse leakage current is 1 μA or less when a reverse voltage VR of 200V is applied, while the score "bad" is given in the case where the reverse leakage current exceeds 1 μA when the reverse voltage VR of 200V is applied.

(7) Evaluation Aspect 7 (Reverse Recovery Time TRR)

Semiconductor devices (pn diodes) are prepared by a method substantially equal to the method of manufacturing a semiconductor device according to the embodiment 4 using the glass composition for protecting a semiconductor junction of the example 4 and the glass composition for protecting a semiconductor junction of the comparison example 1, and a reverse recovery time trr are measured. The baking condition of the glass layer is set such that the glass layer is baked at a temperature of 720° C. for 15 minutes when the glass composition for protecting a semiconductor junction according to the example 4 is used, and the glass layer is baked at a temperature of 870° C. for 15 minutes when the glass composition for protecting a semiconductor junction according to the comparison example 1 is used.

Figure 15:
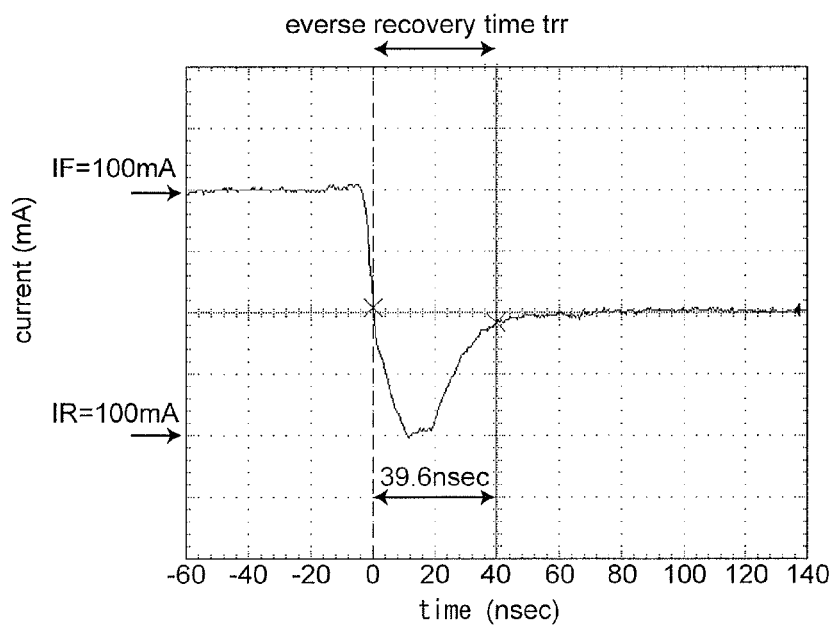
FIG. 15 is a graph for explaining a method of measuring a reverse recovery time trr.
Figure 16A:
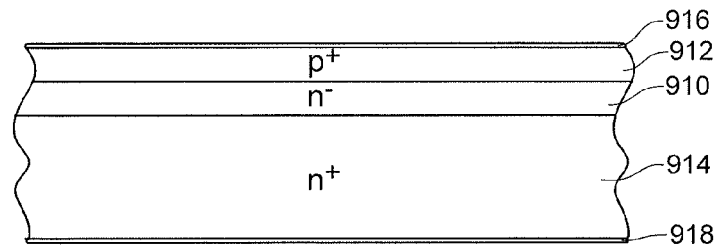
FIG. 16A, FIG. 16B, FIG. 16C, and FIG. 16D are views for explaining a conventional method of manufacturing a semiconductor device.
Figure 16B:
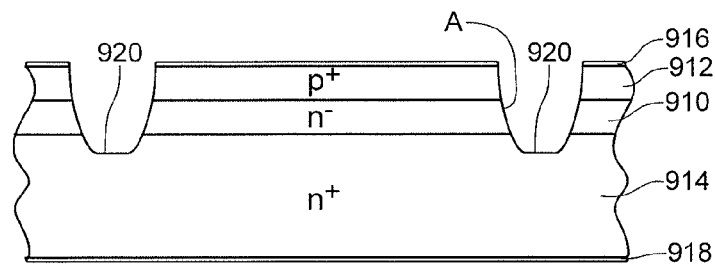
Figure 16C:
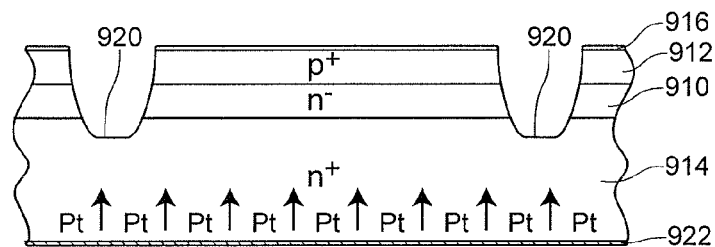
Figure 16D:
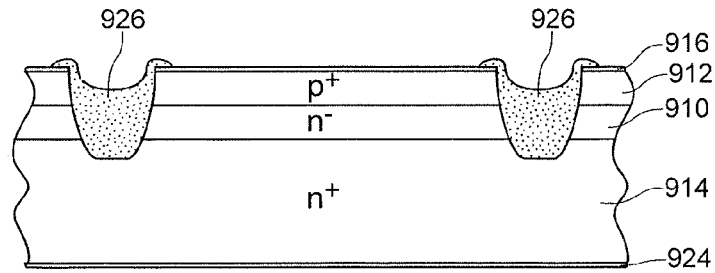
Figure 17A:
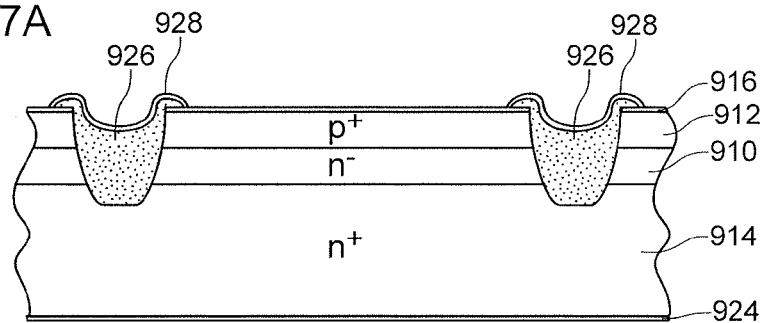
FIG. 17A, FIG. 17B, FIG. 17C, and FIG. 17D are views for explaining the conventional method of manufacturing a semiconductor device.
Figure 17B:
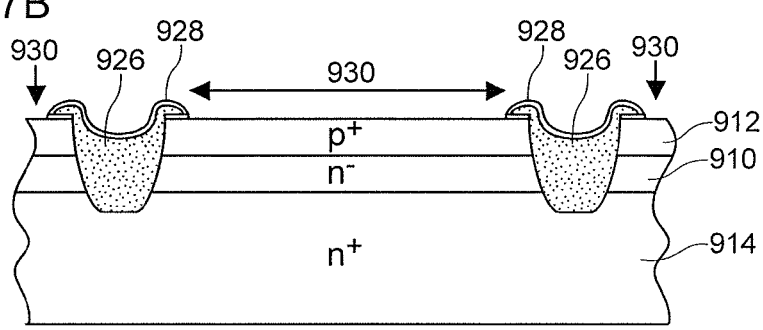
Figure 17C:
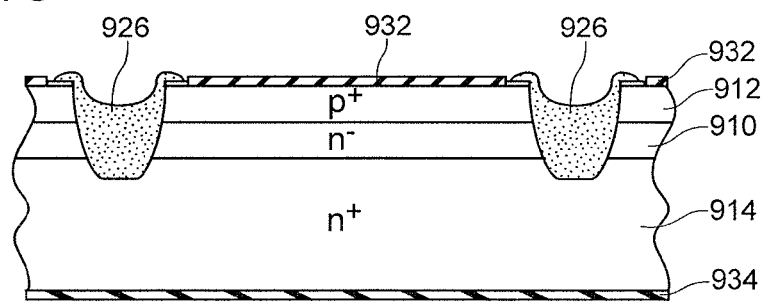
Figure 17D:
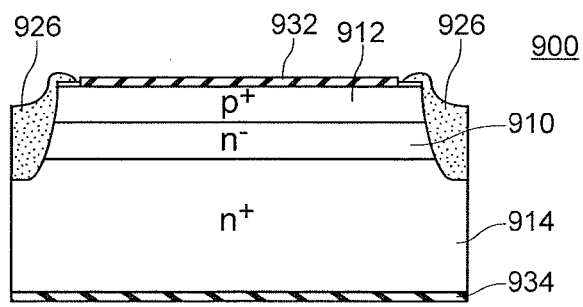

FIG. 15 is a graph for explaining a method of measuring a reverse recovery time trr. The measurement of the reverse recovery time is performed such that, as shown in FIG. 15, a drive voltage is applied to a semiconductor device under a condition that a reverse current of 100 mA flows at maximum when the semiconductor device is turned off (reverse voltage VR=50V) from an ON state where a forward current of 100 mA is supplied to the semiconductor device. That is, as shown in FIG. 15, the reverse recovery time trr is measured as a time from a point of time that the forward current IF is dropped to 0 mA after the semiconductor device is turned off to a point of time that a reverse current IR is attenuated to a value which is 10% of a maximum value (90% recovery time).

As a result of the measurement, it is found that while the reverse recovery time trr is 43.6 ns when the glass composition for protecting a semiconductor junction according to the comparison example 1 is used, the reverse recovery time trr is 39.6 ns when the glass composition for protecting a semiconductor junction according to the example 4 is used. That is, it is found that the reverse recovery time trr when the glass composition for protecting a semiconductor junction according to the example 4 is used is shorter than the reverse recovery time trr when the glass composition for protecting a semiconductor junction according to the comparison example 1 is used by approximately 10%. Based on this result, the score "good" is given to the glass composition for protecting a semiconductor junction according to the example 4, and the score "fair" is given to the glass composition for protecting a semiconductor junction according to the comparison example 1. This result implies that with the use of the glass composition for protecting a semiconductor junction according to the example 4, a baking temperature can be lowered and hence, the carrier recoupling center is hardly decreased by annealing in baking a layer made of the glass composition for protecting a semiconductor junction.

(8) Comprehensive Evaluation (8-1) Comprehensive Evaluation 1

The score "good" is given when the score "good" is given with respect to all of the above-mentioned evaluation aspects 1 to 7. The score "fair" is given when the score "fair" is given with respect to at least one of the above-mentioned evaluation aspects 1 to 7. The score "bad" is given when the score "bad" is given with respect to at least one of the above-mentioned evaluation aspects 1 to 7.

(8-2) Comprehensive Evaluation 2

With respect to the evaluation aspect 3 (chemical resistance), when the Ni plating is performed in a state where the glass protection film is formed so as to cover the surface of the glass layer, the glass layer is not brought into contact with the Ni plating solution and hence, no serious problem arises. Accordingly, by taking into account this fact, the glass compositions for protecting a semiconductor junction according to the examples 2 to 6 have no problem with respect to all evaluation aspects and hence, the score "good" is given with respect to the glass compositions for protecting a semiconductor junction according to the examples 2 to 6.

(8-3) Comprehensive Evaluation 3

In the same manner as the above-mentioned comprehensive evaluation 2, with respect to the evaluation aspect 3 (chemical resistance), when the Ni plating is performed in a state where the glass protection film is formed so as to cover the surface of the glass layer, the glass layer is not brought into contact with the Ni plating solution and hence, no serious problem arises. Also with respect to the evaluation aspect 6 (generation of bubbles), when a semiconductor device is manufactured by a method substantially equal to the method of manufacturing a semiconductor device according to the embodiment 5, no bubbles are generated. Accordingly, by taking into account this fact, the glass compositions for protecting a semiconductor junction according to the examples 1 to 6 have no problem with respect to all evaluation aspects and hence, the score "good" is given with respect to the glass compositions for protecting a semiconductor junction according to the examples 1 to 6.

3. Evaluation Result

As can be understood also from FIG. 11, with respect to the glass composition according to the comparison example 1, the score "fair" is given with respect to the evaluation aspects 2 and 7 and the score "fair" is given with respect to all comprehensive evaluations 1 to 3. With respect to the glass composition according to the comparison example 2, the score "bad" is given with respect to the evaluation aspect 1 and the score "fair" is given with respect to the evaluation aspect 2 so that the score "bad" is given with respect to the comprehensive evaluation.

To the contrary, with respect to the glass compositions for protecting a semiconductor junction according to the examples 2 to 6, although the score "fair" is given with respect to the evaluation aspect 3 (accordingly, the score "fair" is given with respect to the comprehensive evaluation 1), the score "good" is given with respect to the evaluation aspects other than the evaluation aspect 3. In view of the above, it is found that, with respect to the glass composition for protecting a semiconductor junction according to the examples 2 to 6, provided that a semiconductor device is manufactured under a condition that a glass protection film is used in etching the oxide film, the semiconductor device can be manufactured with no problem (accordingly, the score "good" is given with respect to the comprehensive evaluation 2).

Further, with respect to the glass composition for protecting a semiconductor junction according to the example 1, although the score "fair" is given with respect to the evaluation aspects 3 and 5 (accordingly, the score "fair" is given with respect to the comprehensive evaluation 1), the score "good" is given with respect to the evaluation aspects other than the evaluation aspects 3 and 5. In view of the above, it is found that, with respect to the glass composition for protecting a semiconductor junction according to the example 1, provided that a semiconductor device is manufactured under conditions that a glass protection film is used in etching the oxide film and a glass layer is formed on a pn junction surface with an insulation layer interposed therebetween, the semiconductor device can be manufactured with no problem (accordingly, the score "good" is given with respect to the comprehensive evaluation 3).

Although the glass composition for protecting a semiconductor junction, the method of manufacturing a semiconductor device and such a semiconductor device according to the present invention have been explained heretofore in conjunction with the above-mentioned embodiments, the present invention is not limited to the above-mentioned embodiments, and can be carried out without departing from the gist of the present invention. For example, the following modifications are conceivable.

(1) In the above-mentioned embodiments 4 to 6, examples where the present invention is applied to the method of manufacturing a semiconductor device which uses a semiconductor base body made of Si are explained and, in the embodiment 7, an example where the present invention is applied to the method of manufacturing a semiconductor device which uses a semiconductor base body made of SiC is explained. However, the present invention is not limited to such examples. The present invention is also applicable to a method of manufacturing a semiconductor device which uses a semiconductor base body made of GaN.

(2) In the above-mentioned embodiments 1 and 3, although nickel oxide is used as a defoaming agent, the present invention is not limited to nickel oxide. In place of nickel oxide, copper oxide, manganese oxide or zirconium oxide may be used, for example.

(3) Although the present invention relates to "the glass composition for protecting a semiconductor junction which substantially contains none of Pb, As, Sb, Li, Na and K", the present invention also includes "a glass composition for protecting a semiconductor junction which substantially contains none of Pb, P, As, Sb, Li, Na and K".

(4) In the above-mentioned embodiments 4 and 5, although the layer made of the glass composition for protecting a semiconductor junction is formed by the electrophoresis method in the glass layer forming step, the present invention is not limited to such a method. The layer made of the glass composition for protecting a semiconductor junction may be formed by a spin coating method, a screen printing method or a doctor blade method. In this case, the layer made of the glass composition for protecting a semiconductor junction is formed using a paste obtained by mixing the glass composition for protecting a semiconductor junction according to the embodiment 1 and an organic binder as the glass composition for protecting a semiconductor junction.

(5) In the above-mentioned embodiments 6 and 7, although the layer made of the glass composition for protecting a semiconductor junction is formed by the spin coating method in the glass layer forming step, the present invention is not limited to such a method. The layer made of the glass composition for protecting a semiconductor junction may be formed by a screen printing method or a doctor blade method. Further, the layer made of the glass composition for protecting a semiconductor junction may be formed by the electrophoresis method. In the latter case, the layer made of the glass composition for protecting a semiconductor junction is formed using the glass composition for protecting a semiconductor junction according to the embodiment 1 as the glass composition for protecting a semiconductor junction without mixing the glass composition for protecting a semiconductor junction according to the embodiment 1 with the organic binder.

(6) In the above-mentioned respective embodiments, the present invention has been explained by taking the diode (the mesa-type pn diode, the planar-type pn diode or the planar-type Schottky-barrier diode) as an example. However, the present invention is not limited to such examples. The present invention is also applicable to any kinds of semiconductor devices where a pn junction is exposed (thyristors, power MOSFETs, IGBTs and the like, for example).

EXPLANATION OF SYMBOLS

100, 102, 200, 300, 900: semiconductor device, 110,910: n⁻ type semiconductor layer, 112, 912: p type semiconductor layer, 114, 914: n⁺ type semiconductor layer, 116, 118, 124, 916, 918, 924: oxide film, 120, 920: trench, 122, 922: film constituting heavy metal diffusion source, 126, 926: glass layer, 128, 928: glass protection film, 130, 930: electrode forming region, 132, 932: anode electrode, 134, 934: cathode electrode, 136: insulation layer, 210: n⁺ type semiconductor layer, 212: n⁻ type semiconductor layer, 214: p⁺ type semiconductor layer, 216: n⁺ type semiconductor region, 218: film constituting heavy metal diffusion source, 220: glass layer, 222: anode electrode layer, 224: cathode electrode layer, 310: semiconductor base body, 312: n⁺ type semiconductor layer, 314: n⁻ type semiconductor layer, 316: guard ring layer, 318: sacrificial oxide film, 320: Ni ohmic layer, 322: glass layer, 324: barrier metal layer, 326: anode electrode layer, 328: cathode electrode layer, M1,M2,M3,M4,M6: mask, M5: protective resist

The invention claimed is:

1. A method of manufacturing a semiconductor device comprising, in the following order:

a first step of preparing a semiconductor element having a pn junction exposure portion where a pn junction is exposed; and a second step of forming a glass layer such that the glass layer covers the pn junction exposure portion, wherein in the second step, the glass layer is formed using a glass composition for protecting a semiconductor junction made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %.

2. The method of manufacturing a semiconductor device according to claim 1, wherein the second step comprises a step of forming an insulation film on the pn junction exposure portion, and a step of forming the glass layer such that the glass layer covers the pn junction exposure portion with the insulation film interposed therebetween.

3. A semiconductor device comprising:
a semiconductor element having a pn junction exposure portion where a pn junction is exposed; and
a glass layer which is formed such that the glass layer covers the pn junction exposure portion, wherein
the glass layer is formed using a glass composition for protecting a semiconductor junction made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %.

4. The semiconductor device according to claim 3, wherein the glass layer is formed such that the glass layer covers the pn junction exposure portion with an insulation layer interposed therebetween.

5. A glass composition for protecting a semiconductor junction used in forming a glass layer which protects a pn junction in a semiconductor element having a pn junction exposure portion where the pn junction is exposed, wherein
the glass composition for protecting a semiconductor junction is made of fine glass particles prepared from a material in a molten state obtained by melting a glass raw material which contains at least ZnO, $SiO_2$, $B_2O_3$, $Al_2O_3$ and at least two oxides of alkaline earth metals selected from a group consisting of BaO, CaO and MgO with the following contents and substantially contains none of Pb, As, Sb, Li, Na and K, the glass composition for protecting a semiconductor junction containing no filler.

ZnO: 30 mol % to 60 mol %
$SiO_2$: 5 mol % to 45 mol %
$B_2O_3$: 5 mol % to 30 mol %
$Al_2O_3$: 5 mol % to 13 mol %
oxide of alkaline earth metal: 1 mol % to 10 mol %.

6. The glass composition for protecting a semiconductor junction according to claim 5, wherein the glass raw material further contains nickel oxide.

7. The glass composition for protecting a semiconductor junction according to claim 5, wherein the glass raw material further contains $ZrO_2$.

8. The glass composition for protecting a semiconductor junction according to claim 5, wherein a glass transition temperature Tg falls within a range of from 540° C. to 680° C.

9. The glass composition for protecting a semiconductor junction according to claim 5, wherein the content of ZnO falls within a range of from 40 mol % to 56 mol %, the content of $SiO_2$ falls within a range of from 8 mol % to 20 mol %, the content of $B_2O_3$ falls within a range of from 20 mol % to 30 mol %, the content of $Al_2O_3$ falls within a range of from 6 mol % to 10 mol %, and the content of the oxide of an alkaline earth metal falls within a range of from 2 mol % to 5 mol %.

10. The glass composition for protecting a semiconductor junction according to claim 5, wherein the semiconductor element is a semiconductor element made of SiC.

11. The glass composition for protecting a semiconductor junction according to claim 1, wherein the semiconductor element is a semiconductor element made of GaN.

12. The glass composition for protecting a semiconductor junction according to claim 5, wherein the glass raw material substantially contains no Bi.

13. The glass composition for protecting a semiconductor junction according to claim 12, wherein the glass raw material substantially contains no P.

14. The glass composition for protecting a semiconductor junction according to claim 5, wherein the glass layer is a glass layer which is formed such that the glass layer covers the pn junction exposure portion with an insulation layer interposed therebetween.

15. The glass composition for protecting a semiconductor junction according to claim 14, wherein an average linear expansion coefficient within a temperature range of from 50° C. to 500° C. falls within a range of from $4.5 \times 10^{-6}$ to $5.8 \times 10^{-6}$.

16. The glass composition for protecting a semiconductor junction according to claim 1, wherein the semiconductor element is a semiconductor element made of Si.

17. The glass composition for protecting a semiconductor junction according to claim 16, wherein the semiconductor element is a fast recovery diode.

* * * * *